(12) United States Patent
Gorny

(10) Patent No.: US 11,831,274 B2
(45) Date of Patent: Nov. 28, 2023

(54) PHOTOVOLTAIC MODULE WITH A CROSS RAIL ASSEMBLY

(71) Applicant: SunPower Corporation, San Jose, CA (US)

(72) Inventor: Lee J. Gorny, Mountain View, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 0 days.

(21) Appl. No.: 17/892,213

(22) Filed: Aug. 22, 2022

(65) Prior Publication Data
US 2022/0399854 A1 Dec. 15, 2022

Related U.S. Application Data

(63) Continuation of application No. 16/370,792, filed on Mar. 29, 2019, now Pat. No. 11,431,288.
(Continued)

(51) Int. Cl.
*H02S 30/10* (2014.01)
*H02S 20/23* (2014.01)
(Continued)

(52) U.S. Cl.
CPC ............ *H02S 30/10* (2014.12); *H01L 31/048* (2013.01); *H02S 20/23* (2014.12); *H02S 40/34* (2014.12)

(58) Field of Classification Search
CPC .... H02S 30/10; H02S 40/36; H02S 40/30–36; H02S 40/34; H02S 40/345;
(Continued)

(56) References Cited

U.S. PATENT DOCUMENTS

| 3,367,080 A | 2/1968 | McClelland |
| 4,112,922 A | 9/1978 | Skinner et al. |

(Continued)

FOREIGN PATENT DOCUMENTS

| DE | 3611542 A1 * | 10/1987 |
| EP | 0188096 A2 | 7/1986 |

(Continued)

OTHER PUBLICATIONS

Extended European Search Report, Application No. 19778402.8-1230; PCT/US2019025039, dated Jan. 23, 2021.
(Continued)

*Primary Examiner* — Ryan S Cannon
(74) *Attorney, Agent, or Firm* — GRASSO PLLC

(57) ABSTRACT

One embodiment is a photovoltaic (PV) module including a frame to receive a perimeter of a backside of a photovoltaic (PV) laminate. The cross rail assembly may include: a conductive frame to receive a perimeter of a backside of a photovoltaic (PV) laminate; one or more conductive cross rail members provide structural rigidity to the conductive frame; and one or more pairs of couplers coupled to the conductive frame, wherein: at least one coupler comprises a grounding coupler having a first keyed section to insert into an opening in the conductive frame and a second keyed section to mate with an end of a conductive cross rail member of the one or more conductive cross rail members to ground the conductive cross rail member to the frame; or at least one coupler of at least one of the one or more pairs includes a length to define a cabling channel.

16 Claims, 19 Drawing Sheets

Related U.S. Application Data

(60) Provisional application No. 62/651,035, filed on Mar. 30, 2018, provisional application No. 62/660,835, filed on Apr. 20, 2018.

(51) Int. Cl.
 *H02S 40/34* (2014.01)
 *H01L 31/048* (2014.01)

(58) Field of Classification Search
 CPC .... F24J 2/5262; F24S 25/20; F24S 25/63–70; F24S 2025/80–807; F24S 2025/018; F24S 2025/023; F24S 2025/6007; F24S 2025/6008; F24S 25/634; F24S 25/636; E06B 3/96–99
 See application file for complete search history.

(56) References Cited

U.S. PATENT DOCUMENTS

| | | | |
|---|---|---|---|
| 4,132,570 A | 1/1979 | Caruso et al. | |
| 4,293,731 A | 10/1981 | Schweig et al. | |
| 4,313,420 A | 2/1982 | Poeschl | |
| 4,392,484 A | 7/1983 | Aloi et al. | |
| 6,959,520 B2 | 11/2005 | Hartman | |
| 8,237,565 B2 | 8/2012 | Tiernay | |
| 2001/0001424 A1 | 5/2001 | Sasaoka | |
| 2005/0115178 A1* | 6/2005 | Schmidt | E06B 3/9641 52/272 |
| 2008/0172955 A1 | 7/2008 | McClintock et al. | |
| 2009/0038674 A1 | 2/2009 | Bieber | |
| 2010/0096073 A1 | 4/2010 | Adriani et al. | |
| 2010/0132766 A1 | 6/2010 | Jenkins | |
| 2010/0236183 A1 | 9/2010 | Cusson et al. | |
| 2011/0000519 A1* | 1/2011 | West | H02S 20/30 136/244 |
| 2011/0180680 A1 | 7/2011 | Brodam | |
| 2011/0203637 A1 | 8/2011 | Patton et al. | |
| 2011/0226335 A1 | 9/2011 | Naitoh et al. | |
| 2012/0285614 A1* | 11/2012 | Davies | B29C 65/542 156/305 |
| 2012/0312356 A1 | 12/2012 | Mizuo et al. | |
| 2013/0019857 A1 | 1/2013 | Li et al. | |
| 2013/0037087 A1* | 2/2013 | Janssens | F24S 25/636 136/251 |
| 2013/0061912 A1 | 3/2013 | Beck et al. | |
| 2013/0102165 A1 | 4/2013 | DuPont | |
| 2013/0298962 A1 | 11/2013 | Sargento | |
| 2014/0329420 A1 | 11/2014 | Magno | |
| 2015/0129016 A1 | 5/2015 | Richardson | |
| 2015/0295534 A1 | 10/2015 | Maruyama et al. | |
| 2015/0357964 A1 | 12/2015 | McPheeters et al. | |
| 2016/0134231 A1 | 5/2016 | Wu et al. | |
| 2016/0315580 A1 | 10/2016 | Patton | |
| 2017/0237388 A1 | 8/2017 | Praca et al. | |
| 2018/0006598 A1 | 1/2018 | Bunea | |
| 2020/0313605 A1 | 10/2020 | Diesta et al. | |
| 2020/0321908 A1 | 10/2020 | Anders et al. | |

FOREIGN PATENT DOCUMENTS

| | | | |
|---|---|---|---|
| EP | 0188096 A3 | 9/1986 | |
| JP | H09148612 A | 6/1997 | |
| JP | 2010283397 A | * 12/2010 | ............. F24J 2/5211 |
| KR | 101571050 B1 | 11/2015 | |
| WO | 2015116911 A1 | 8/2015 | |

OTHER PUBLICATIONS

European Search Report, Application No. 19778402.8-1230; PCT/US2019025039, dated Nov. 27, 2020.
JPH09148612A3, Patent Abstracts of Japan, © 1997 JPO.
http://www.aluminumextrusion-profiles.com/sale-7597028-roof-6063-t5-aluminum-solar-panel-frame-border-black-40-40mm.html, printed from the internet on Mar. 25, 2019.
International Search Report and Written Opinion from International Application No. PCT/US2019/025039 dated Jul. 18, 2019, 11 pgs.

* cited by examiner

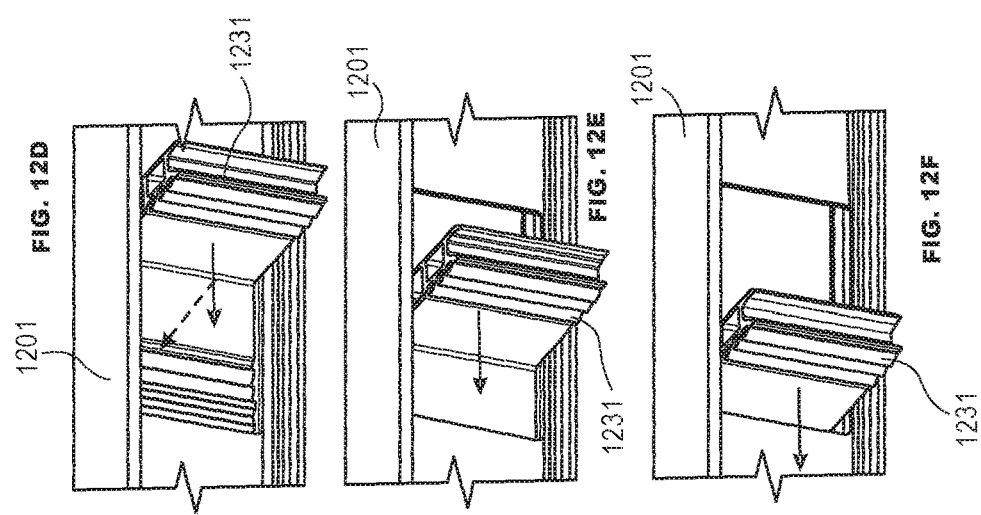
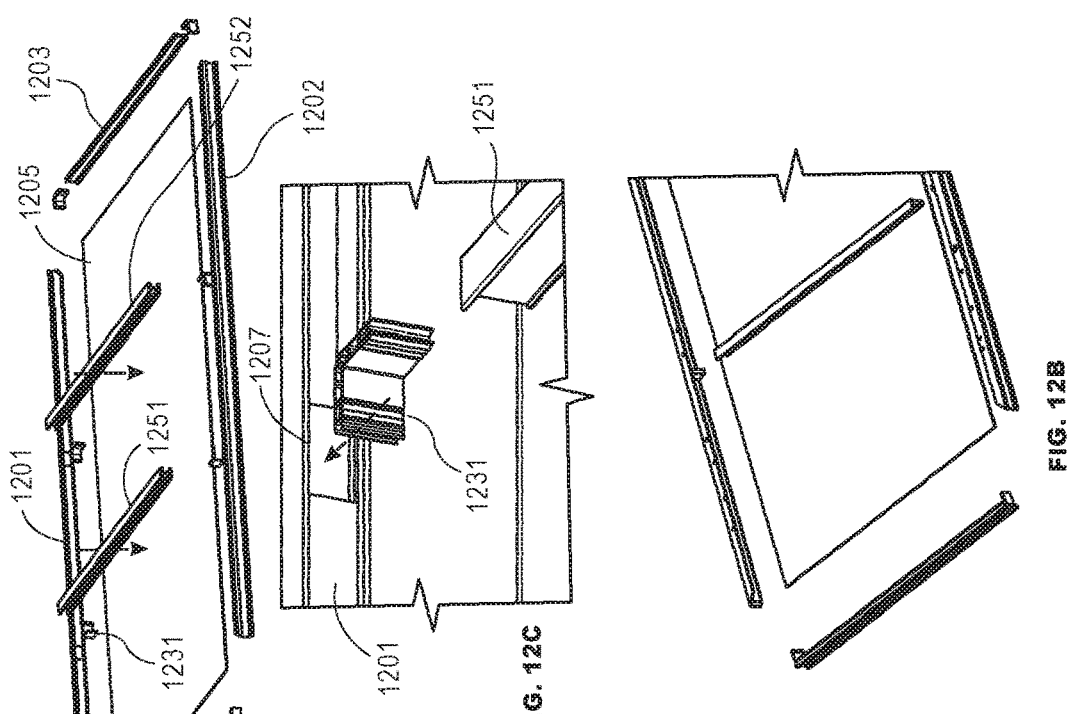
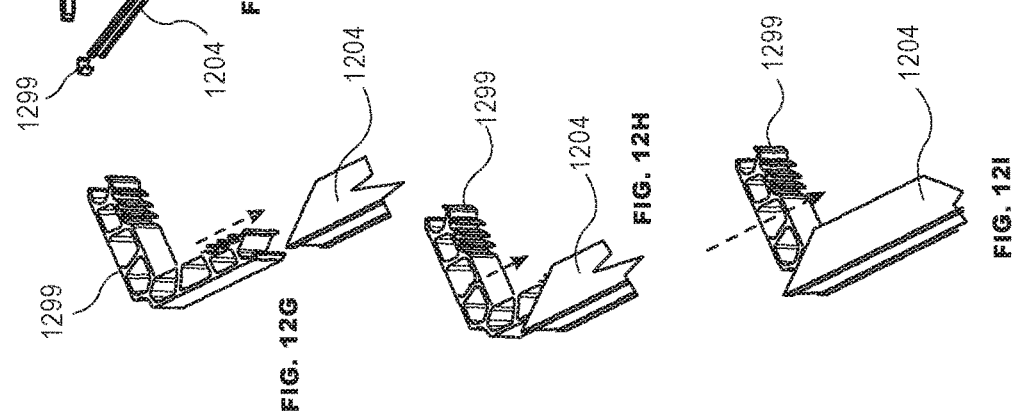

PHOTOVOLTAIC MODULE WITH A CROSS RAIL ASSEMBLY

PRIORITY

The present application is a continuation of U.S. patent application Ser. No. 16/370,792, which was filed Mar. 29, 2019. The '792 application claims the right of priority to and benefit of earlier filing date of U.S. Provisional Application Ser. No. 62/651,035, filed Mar. 30, 2018, and U.S. Provisional Application Ser. No. 62/660,835, filed Apr. 20, 2018, each of which is hereby incorporated by reference herein in its entirety.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number can be used to indicate a similar feature or a feature with similar functionality, as can non-identical reference numbers. The figures are not drawn to scale.

FIGS. 12A-I illustrates a process of assembling a PV module similar to the PV module of FIGS. 5A-D, according to various embodiments.

DETAILED DESCRIPTION

Figure 1A:
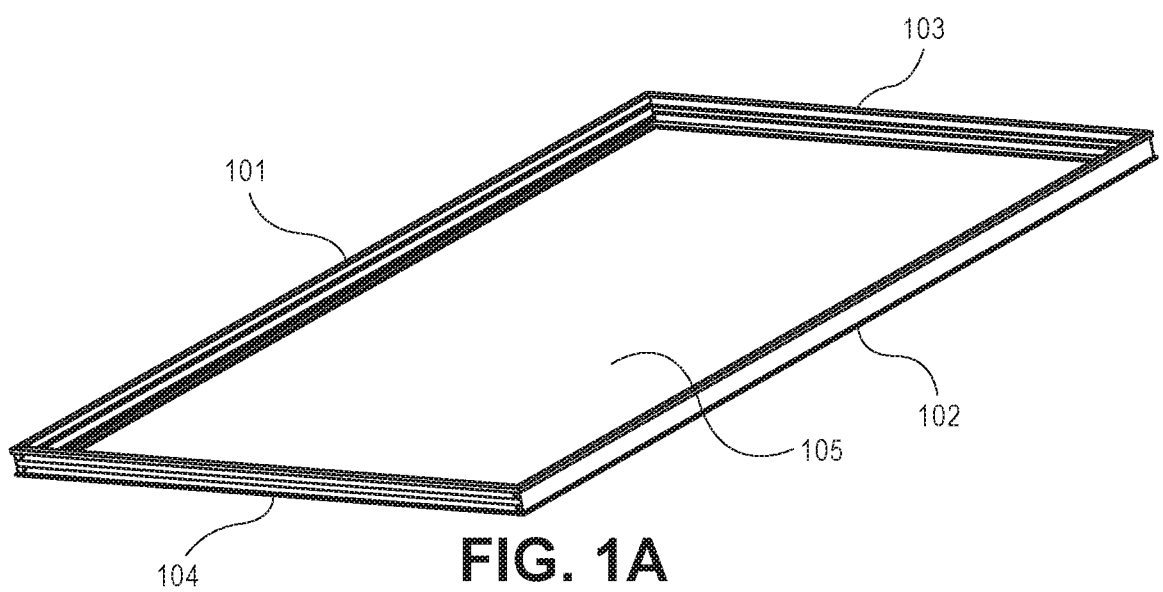
FIG. 1A illustrates a perspective view of a bottom of a photovoltaic (PV) module that includes a PV laminate mounted on a frame.

The following detailed description is merely illustrative in nature and is not intended to limit the embodiments the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

"Comprising" is an open-ended term that does not foreclose additional structure or steps.

"Configured to" connotes structure by indicating a device, such as a unit or a component, includes structure that performs a task or tasks during operation, and such, structure is configured to perform the task even when the device is not currently operational (e.g., is not on/active). A device "configured to" perform one or more tasks is expressly intended to not invoke 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" IEC does not necessarily imply that this IEC is the IEC in a sequence; instead the term "first" is used to differentiate this IEC from another IEC (e.g., a "second" IEC).

"Based On." As used herein, this term is used to describe one or more factors that affect a determination. This term does not foreclose additional factors that can affect a determination. That is, a determination can be solely based on those factors or based, at least in part, on those factors. Consider the phrase "determine A based on B." While B can be a factor that affects the determination of A, such a phrase does not foreclose the determination of A from also being based on C. In other instances, A can be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit" describes a reducing, lessening, minimizing, or effectively or actually eliminating something, such as completely preventing a result, outcome or future state completely.

The terms "a" and "an" are defined as one or more unless this disclosure explicitly requires otherwise.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" can be substituted with "within [a percentage] of" what is specified, where the percentage includes 0.1, 1, 5, and 10 percent.

As used herein, "regions" can be used to describe discrete areas, volumes, divisions or locations of an object or material having definable characteristics but not always fixed boundaries.

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure can be practiced without these specific details. In other instances, well-known techniques are not described in detail in order to not unnecessarily obscure embodiments of the present disclosure.

Photovoltaic (PV) modules can generate direct current (DC) power based on received solar energy. PV modules can include several solar or PV cells electrically coupled to one another allowing the PV cells to contribute to a combined output power for a PV module. Some PV modules include a PV laminate encapsulating solar cells and a rectangular frame on which a perimeter of the PV laminate 105 is mounted. FIG. 1A illustrates a perspective view of a PV module including a frame (e.g., a metal frame) with a first side on which the perimeter of the PV laminate 105 is mounted, and a second opposite side. The frame includes a first frame member 101, a second frame member 102, a third frame member 103, and a fourth frame member 104.

Figure 1B:
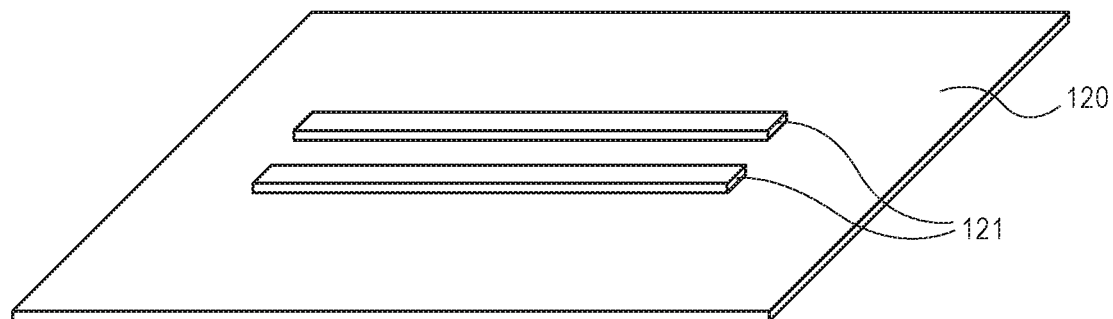
FIG. 1B illustrates a perspective view of a roof and a mounting frame for mounting the PV module of FIG. 1A.

A PV module can be mounted on mounting rails of a mounting frame, which can be located on a roof in some applications. FIG. 1B illustrates a perspective view of a mounting frame 121 located on a roof 120. The second side of the mounting frame (FIG. 1A) can contact the mounting frame 121. Depending on installation requirements and/or application, either the second side of the long members 101 and 102 of the frame (FIG. 1) can contact the mounting frame 121, or the second side of the short members 103 and 104 of the frame (FIG. 1) can contact the mounting frame 121.

Figure 2A:
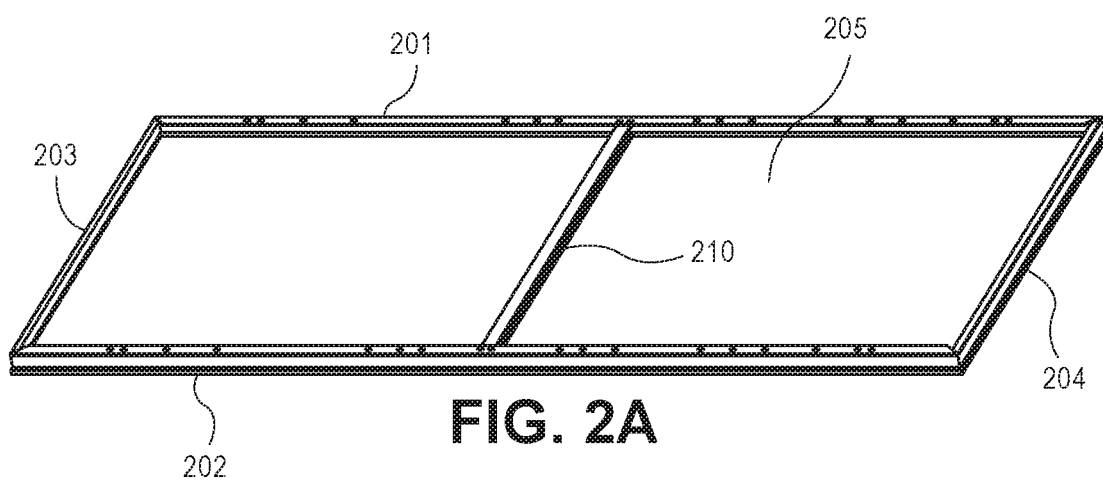
FIG. 2A illustrates a perspective view of a cross rail attached to a PV module similar to the PV module of FIG. 1A.

Referring now to FIG. 2A, some PV modules can include at least one cross rail 210. The use of one or more cross rails 210 can inhibit cell cracking in the PV modules. Also, the use of one or more cross rails 210 can enable different dimensions and materials to be used with the frame and/or the PV laminate 205 (e.g., a lighter frame, a thinner PV laminate and/or a PV laminate with a different combination of layers). In the illustrated example, the cross rail 210 extends from a first long member 201 of the frame to a second long member 202 of the frame; however, in other examples a longer and/or heavier cross rail 210 can extend from a first short member 203 of the frame to a second short member 204 of the frame.

Figure 2B:
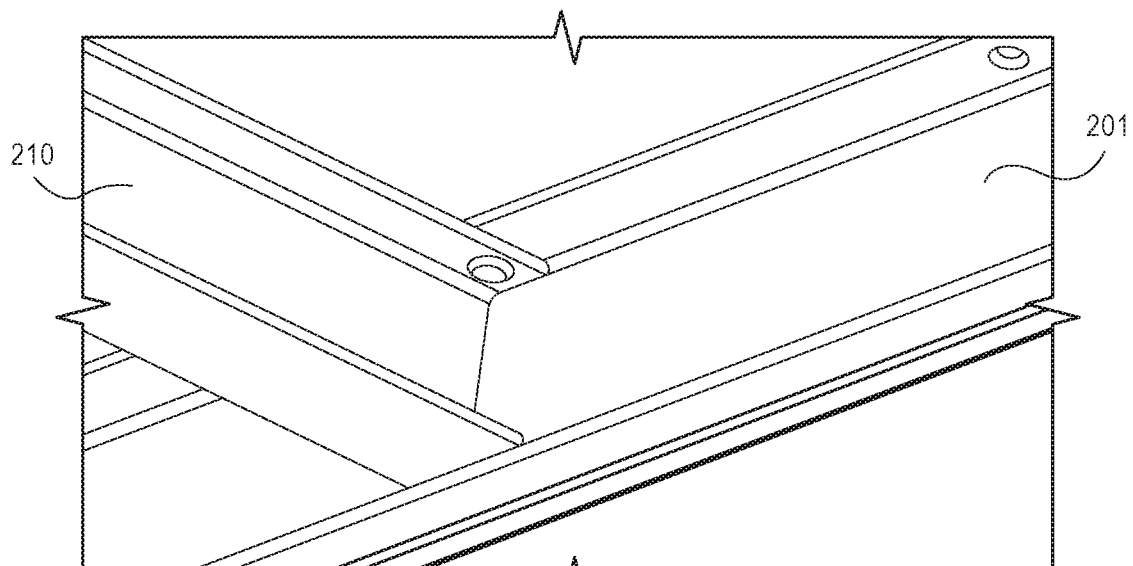
FIG. 2B illustrates a perspective view of a point of attachment of the cross rail to the PV laminate of the PV module of FIG. 2A.
Figure 2C:
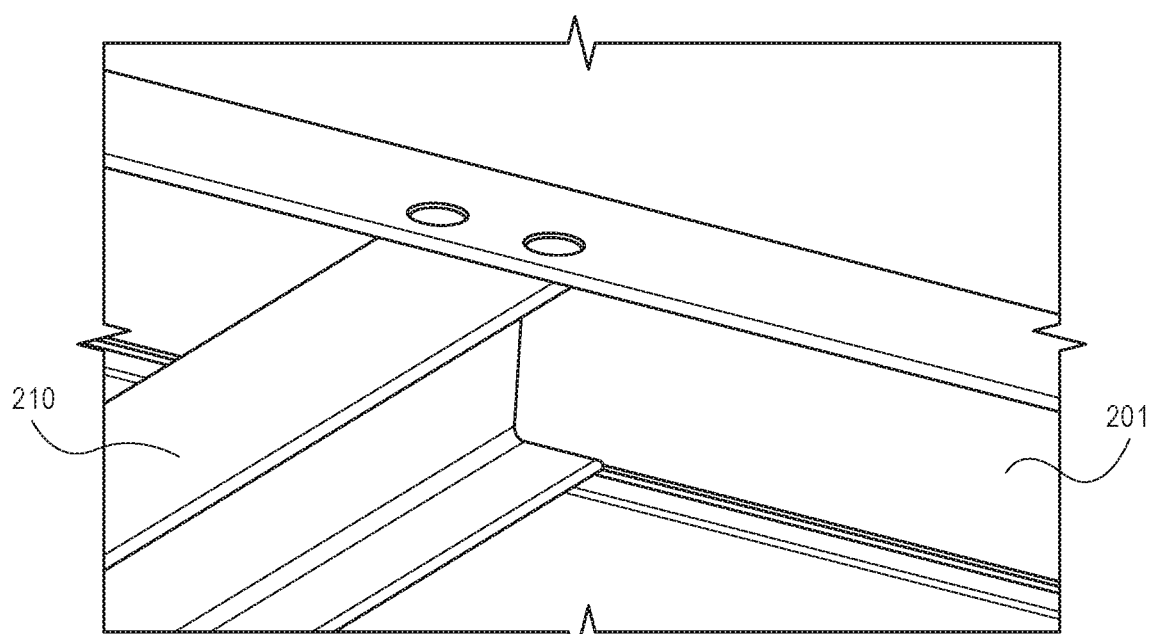
FIG. 2C illustrates a perspective view of a point of attachment of the cross rail to a bottom lip of a long member of the frame of the PV module of FIG. 2A.

The cross rail 210 can also include metal, and as such, building codes can require that the cross rail 210 to be grounded to the frame. In some PV modules, this continuous material path requirement can be addressed by running the cross rail 210 immediately against the inside of the frame. Screws or rivets can be used to achieve continuity—these can be screwed or inserted into the frame. FIG. 2B illustrates an example in which a rivet is inserted through a top flange of the cross rail 210 and the frame 201 (and/or through a PV laminate). FIG. 2C illustrates an example in which a rivet is inserted through a bottom flange of the cross rail 210 and a bottom flange of the frame 201.

In some applications, the PV module can include various other components. DC power generated by the PV module can be converted to AC power through the use of a power inverter. The power inverter can be electrically coupled to an output of the PV module (an output of the PV module can include electrical connections protruding from a backsheet of the PV laminate—these electrical connections can also be encapsulated by a junction box in some examples). Intervening wiring (e.g., DC-4 connectors) can be used between the PV module, junction box and the power inverter. The power inverter can be electrically coupled to the DC output of the PV module (e.g., the PV cables). The power inverter can be located physically apart from the PV module, with only the intervening wiring and/or accessories thereof physically coupling the PV module to the power inverter.

During installation of PV modules with no cross rails, the PV module can be positioned in any configuration on the mounting frame, and the PV cables can be installed between the mounting frame (FIG. 1B) and the PV laminate (FIG. 1A). This makes installation easy for installers, and allows application requirements—not cabling requirements—to drive the selection of a position of the PV module on the mounting frame.

In contrast, installation of PV modules with one or more cross rail can be problematic. If a desired position of the PV module would cause the cross rail to form a "double wall" with the mounting frame, that desired position cannot be accomplished by the installer (it is against code to route the PV cables under the "double wall" (e.g., under the mounting frame). For this reason, installers and/or consumers can disfavor PV modules with cross rails.

While a PV module can include short cross rail members to allow a cable to be strung between a mounting rail and the short cross rail member even when one of the short cross rail members is mounted over, and parallel with, a mounting rail of a mounting frame, a mechanical strength of such a design is not necessarily compatible with some PV laminates and/or some PV frames. Further, mechanical strength and/or volume of material used for such a cross member can be sub-optimal due to beam inertia being proportional to its height cubed. Some embodiments disclosed herein can include a cross rail assembly including a cross rail member that is taller than such a short cross rail member (e.g., as tall as members of the frame or at least taller than the short cross rail member under which cabling can be strung). Such a cross rail assembly can include one or more sections to define one or more channels through which cables can be strung even when the cross rail assembly is mounted over, and in parallel with, a mounting rail. In embodiments in which the cross rail assembly includes a metal cross rail member attached to the frame using a pair of spacers to define the channel, the metal cross rail member can be electrically connected to the frame only through the pair of spacers.

One embodiment can include an apparatus having a frame to receive a perimeter of a backside of a photovoltaic (PV) laminate; one or more cross rail members can provide structural rigidity to the frame; and one or more pairs of couplers can be coupled to the frame, each coupler of the pair including a first section to define a channel and a second keyed section inserted into a different end of a corresponding cross rail member of the one or more cross rail members; wherein each cross rail member can be electrically connected to the frame only through the couplers of a corresponding one of the one or more pairs.

One embodiment can include an apparatus having a cross rail assembly to be used in a photovoltaic (PV) module. In an example, the apparatus can include a PV laminate having a front side, a back side, and a plurality of solar cells encapsulated between the front side and the back side; a frame, wherein a perimeter of the PV laminate is mounted on the frame. The cross rail assembly can provide structural rigidity to the PV laminate and the frame. The cross rail assembly can include a plurality of sections, and a height of one or more of the sections can be less than a height of the remaining section(s). If the cross rail assembly is placed over a mounting rail at an installation site, a tunnel can be formed by one or more sections of the cross rail assembly and one or more respective regions of the mounting rail. An installer can string cabling through the one or more tunnels. Other embodiments can be disclosed and/or claimed.

One embodiment is an apparatus for use in a photovoltaic (PV) assembly, the PV assembly including one or more mounting rails and a PV module including a frame and a PV laminate having a front side, a back side, and a plurality of solar cells encapsulated between the front side and the back side, wherein a perimeter of the PV laminate is mounted on the frame. The apparatus includes one or more cross rail assemblies to provide structural rigidity to the PV laminate and the frame, each cross rail assembly extending from a first member the frame to a second member of the frame, the cross rail assemblies grounded to the frame and having a first side facing the back side of the PV laminate and a second opposite side. At least one of the one or more cross rail assemblies includes one or more first sections having one or more heights that are less than height(s) of remaining sections of the at least one cross rail assembly, wherein the one or more first sections of the at least one cross rail assembly define one or more channels. The one or more channels comprise one or more tunnels when the at least one cross rail assembly is mounted over, and in parallel with, a mounting rail of the one or more mounting rails. Other embodiments can be disclosed and/or claimed.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 3:
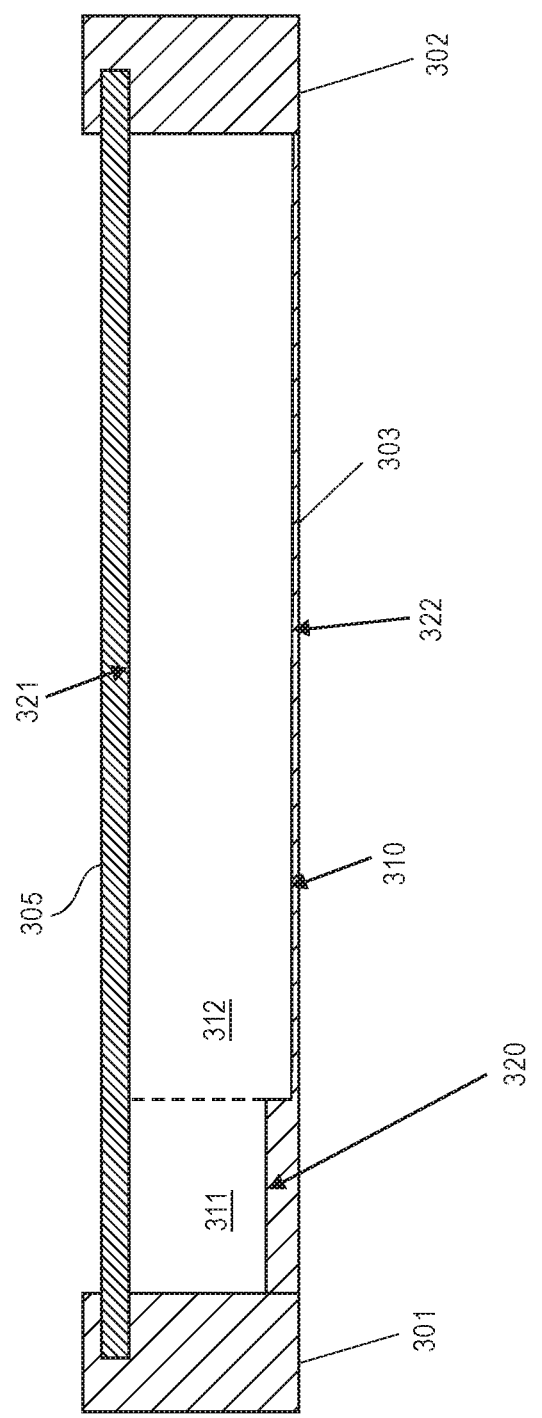
FIG. 3 illustrates a cross-sectional view of a PV module with a cross rail assembly, in which the cross sectional view exposes a side of the cross rail assembly, according to various embodiments.

FIG. 3 illustrates a cross-sectional view of a PV module 300 with a cross rail assembly 310, in which the cross sectional view exposes a side of the cross rail assembly 310, according to various embodiments. The PV module 300 includes a PV laminate 305, a first frame member 301 (e.g., a long side frame member), a second frame member 302 (e.g., a long side frame member), a third frame member 303 (e.g., a short side frame member), and a fourth frame member (not shown). The cross rail assembly 310 includes a first section 311 and a second section 312. The cross rail assembly 310 includes a first side 321 facing the PV laminate 305, and a second opposite side 322. In the first section 311, the second side 322 can define a channel 320, e.g., a cabling channel. In some embodiments, the channel 320 can include a cable management feature that can be used for cabling (not shown) to be strung through the channel 320 by an installer. In any embodiment, the cross rail assembly 310 can have a third section (not shown) similar to the first section but on the other end of the cross rail assembly 310 to provide channel 320 on both sides.

In the illustration, the cross rail assembly 310 is shown as in contact with the back side of the PV laminate 305. In embodiments in which the cross rail assembly 310 is in contact with the PV laminate 305 (e.g., at 321 as shown), an adhesive can be located between the cross rail assembly 310 and the back side of the PV laminate 305, which can serve to limit deflection in both upward and downward loading. Also, in some embodiments, only the second section 312 is in contact with the PV laminate 305. For instance, for ease of installation, the first section 311 can define an additional channel (not shown) similar to channel 320 between the PV laminate and the first section 311. In some embodiments, the additional channel, which can eliminate left and right hand designations in a parts list for the cross rail assembly 310, can be referred to as a "dummy" channel because all cabling can be strung through the channel 320.

Figure 5A:
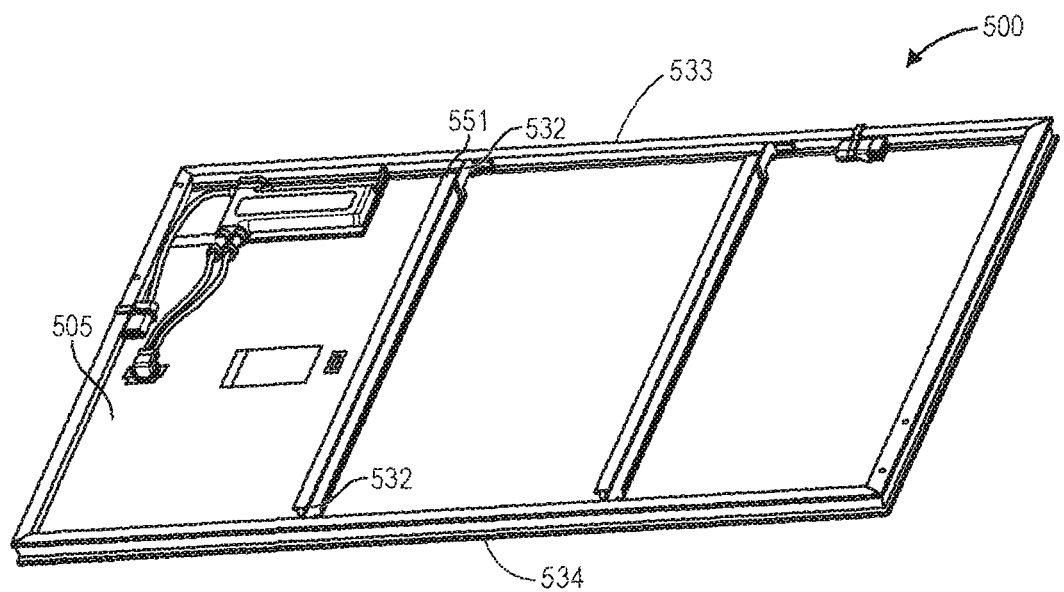
FIGS. 5A-D illustrate a perspective view of a PV module with a cross rail assembly similar to the cross rail assembly of FIG. 4A, according to various embodiments.

The cross rail assembly 310 can include any conductive cross rail member and any pair of any grounding couplers described herein. Referring briefly to FIG. 5A, some conductive cross rail member 551 may span only a portion of the distance between long side frame members 533 and 534. One of the couplers of the pair 532 of FIG. 5A may span the reminder of the distance to define a cabling channel. The other coupler of the pair 532 may be different, e.g., may not define a cabling channel.

Referring again to FIG. 3, in other embodiments, the cross rail assembly 310 can include a conductive cross rail member spanning an entire distance between the first frame member 301 and the second frame member 302. FIG. 4D illustrates a perspective view of a cross rail assembly including a conductive cross rail member 454 to span an entire distance between opposite members of a frame. In these embodiments, the conductive cross rail member 454 can penetrate an opening 471, e.g., a spine opening, in a frame member. As will be explained later in greater detail, the conductive cross rail member 454 can be grounded to the frame by the grounding coupler or by the interface between the ends of the conductive cross rail member 454 and an interior of the frame member Referring once again to FIG. 3, the second section 312 is illustrated as having a second side in a different plane than a second side of the frame (which reveals the third frame member 303); however, in other examples second section 312 can have a second side in a same plane as a second side of the frame. In particular, the second section 312 can have any height that is greater than the height of the first section 311 and no greater than the height of the frame. Accordingly, the PV module 300 can be mounted over, and in parallel with, a mounting rail. The PV panel 300 can be compatible with a wide variety of PV laminate designs and/or frame designs, can be light weight, and can be inexpensive to manufacture and/or install.

A shape of the channel 320 is shown as a rectangular; however, in other embodiments the channel 320 can have any shape that is operable for stringing cabling through the channel 320 during installation. Also, in the illustrated example, the channel 320 is defined by the first section 311 of the cross rail assembly 310, the first frame member 301, and the second section 312 of the cross rail assembly 310. In other examples, the channel 320 can be defined by only the first section 311 and the first frame member (as in a curved channel 820, shown in FIG. 8A). In other examples, it can be possible and practical to define the channel 320 in only the first section 311 (e.g., the channel 320 need not necessarily be defined by a side of the first member 301).

The first frame member 301 can be a long side frame member of a rectangular frame in some embodiments. In other embodiments, the first frame member 301 can be a short side frame member of a rectangular frame.

Figure 4A:
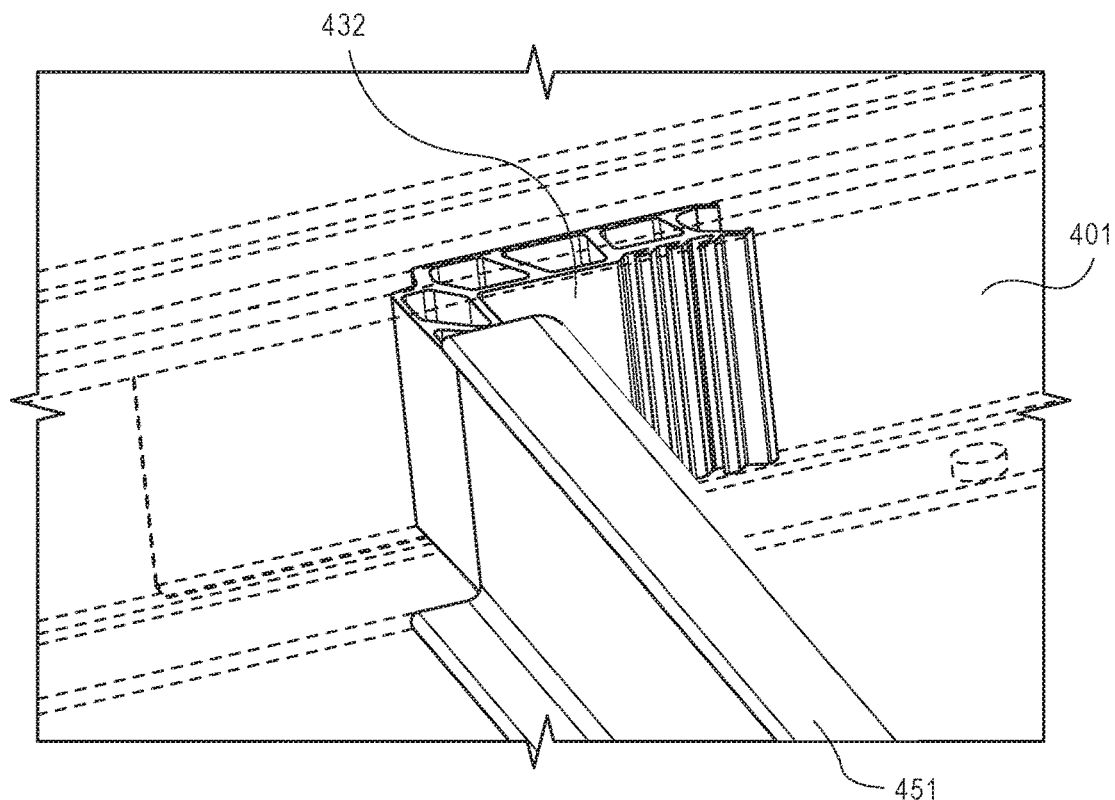
FIG. 4A illustrates a perspective view of a cross rail assembly including corner key held to a pocketed member of a frame of a PV module, according to various embodiments.
Figure 4B:
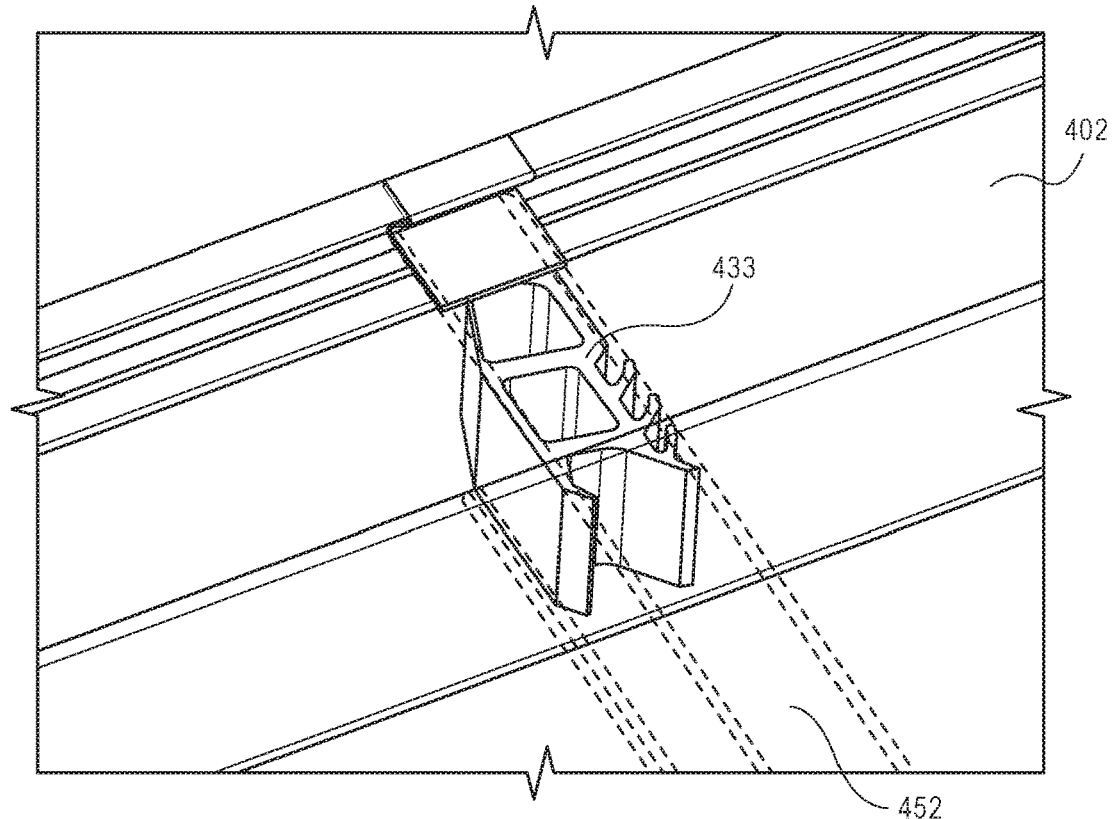
FIG. 4B illustrates a perspective view of a cross rail assembly including a T corner key attached to segments of a member of a frame of a PV module, according to various embodiments.
Figure 4C:
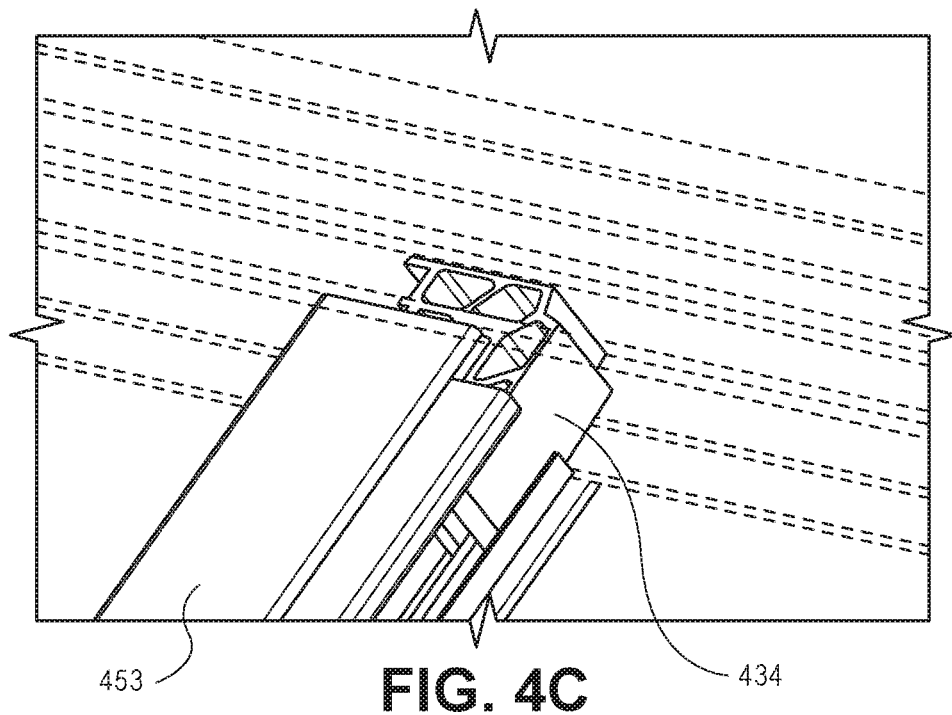
FIG. 4C illustrates a perspective view of a cross rail assembly including a short corner key attached to a key slot of a member of a frame of a PV module, according to various embodiments.
Figure 4D:
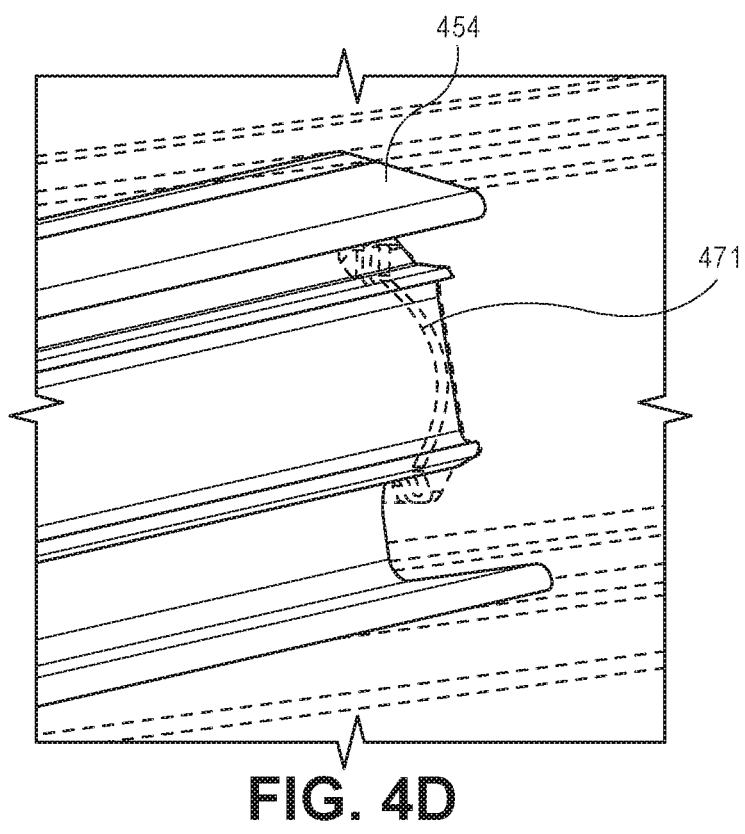
FIG. 4D illustrates a perspective view of a cross rail assembly attached to a splined hole in a member of a frame of a PV module, according to various embodiments.

FIG. 4A illustrates a perspective view of a cross rail assembly including a cross rail 451 and a corner key 432 held to a pocketed member of a frame 401 of a PV module, according to various embodiments. FIG. 4B illustrates a perspective view of a cross rail assembly including a cross rail 452 and a T corner key 433 attached to segments of a member of a frame 402 of a PV module, according to various embodiments. FIG. 4C illustrates a perspective view of a cross rail assembly including a cross rail 453 and a short corner key 434 attached to a key slot of a member of a frame of a PV module, according to various embodiments. FIG. 4D illustrates a perspective view of a cross rail assembly including a cross rail member 454 attached to a splined hole 471 in a member of a frame of a PV module, according to various embodiments.

FIGS. 5A-D illustrate a PV module 500 with a cross rail assembly similar to the cross rail assembly of FIG. 4A, according to various embodiments. Referring to FIG. 5A, a PV module 500 includes a PV laminate 505, which can be similar to any PV laminate described herein. In this embodiment, components such as a microinverter, a junction box, or the like, can be mounted on a backside of the PV laminate 505. The PV module 500 also includes a cross rail assembly, which can be similar to any cross rail assembly described herein. The cross rail assembly includes a cross rail member 551 and a pair 532 of couplers. The cross rail member 551 can be electrically connected to the frame through the pair 532 and/or one or more of the couplers of the pair 532, e.g., electrically connected to the frame only through the pair 532. In FIG. 5A, electrical cabling is routed in a volume defined by the frame and the cross rail member 551 so that the cables do not impede contact between the cross rail member 551 (or the frame) and the mounting frame 121 (FIG. 1B) and/or the roof 120 (FIG. 1B) and can also simplify installation/assembly/transport.

Figure 5B:
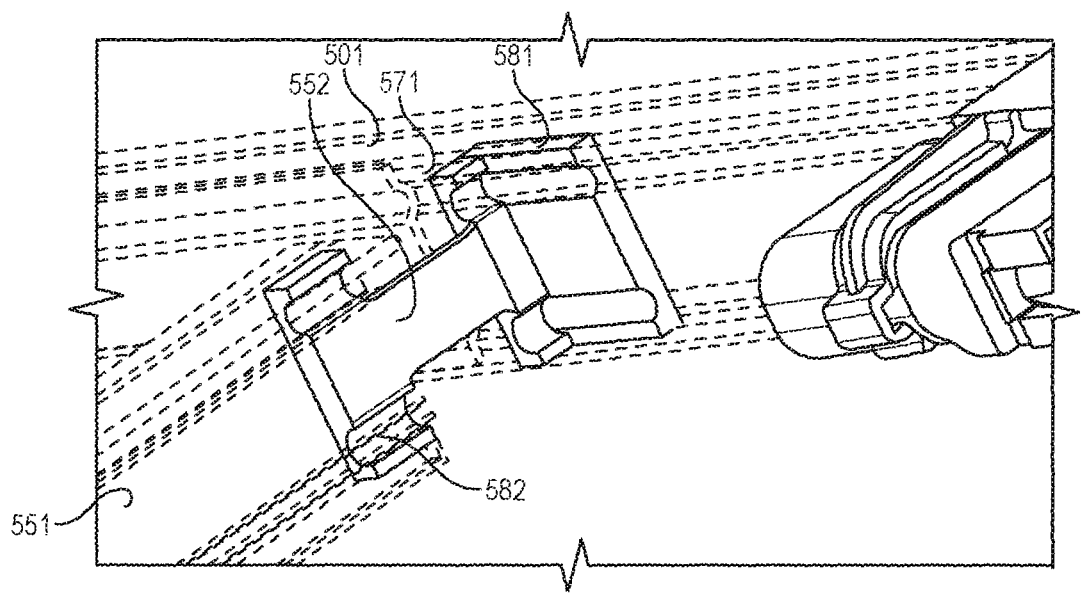

Referring to FIG. 5B, a coupler 552 of the pair 532 (FIG. 5A) is illustrated. This coupler 552 can include a first projection 581 and a second projection including an end 582. In an example, the first projection 581 and the second projection can be arranged in an L shape. The end 582 can be formed (e.g., keyed, molded, extruded) to mate with a cavity in an end of the cross rail member 551.

The frame member 501 includes an opening 571 providing access to a cavity. The cavity can be defined by an interior wall and an exterior wall of the frame member 501. The first projection 581 can be located in the cavity and keyed to mate with the cavity. In an example, locating the first projection 581 in the cavity can lock the first projection 581 in position at the cavity. Locating the first projection 581 in the cavity can be performed after insertion into the opening 571.

Figure 5C:
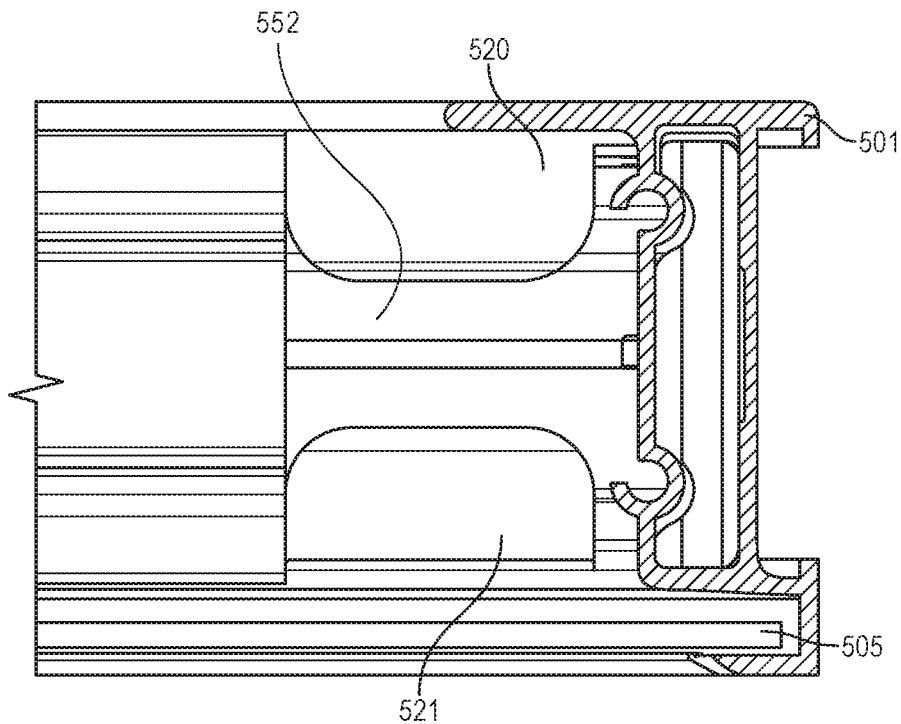

Referring to FIG. 5C (which is a section view looking perpendicular to the cross rail assembly and parallel to the frame member 501), the coupler 552 can define channels 520 and 521. In this view, a cross-sectional view of a frame portion and a plan view of the coupler 552 is shown. In this example, channel 520 can be used to string cabling during installation of the PV module 500 (FIG. 5A). In contrast, the channel 521 can be a dummy channel in some examples (it can be an artifact of manufacturing coupler 552 without any left/right part designations, not intended to be used for stringing cabling). Of course, channel 521 can be a dummy channel for some PV module 500 install configurations or can receive cabling in other PV module 500 install configurations, depending on applications. In this example, coupler 552 and the frame member 501 flange corresponding to channel 520 define a cable management feature. Also, the interior sidewall of the frame member 501 can also define cable management features for hanging cabling strung through the channel 520.

Regarding the electrical connection to the frame through the pair 532 (FIG. 5A, e.g., only through the pair 532), FIG. 5C, in particular, illustrates the "metal on metal" contact (which may also be referred to as contact optimized for electrical grounding) between the coupler 552 and the inside of the frame member 501 (specifically with an inside of an exterior wall of the frame member 501). While an exterior of the frame member 501 can be anodized to prevent corrosion (which involves a layer of a relatively poor conductor such as an oxide on an anodized surface), the inside of the frame member 501 may not be anodized. For this or other reasons, an electrical resistivity of the surface of the outside of a frame member (e.g., a hollow frame member) may be greater than an electrical resistivity of the surface of an inside of the frame member. Therefore, the "metal on metal" can refer to contact between non-anodized surfaces of metal components. In some examples of PV modules, metal fasteners are required to puncture an anodized surface to meet grounding requirements, which may not be required due to the contact on the inside of the frame member 501.

Figure 5D:
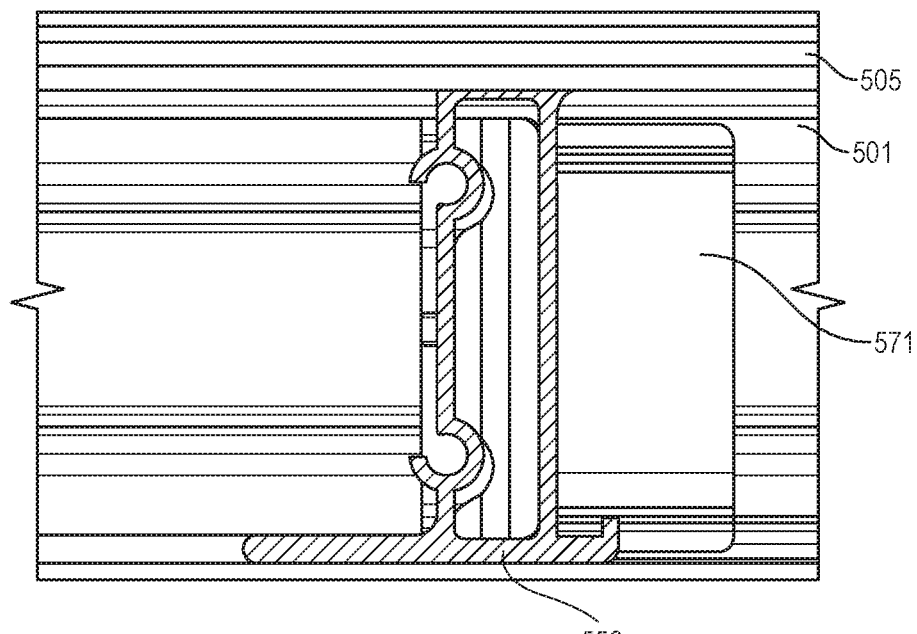

FIG. 5D illustrates a perspective view of a cross section through the coupler 552 (e.g., a section view looking perpendicular to the frame member 501 and parallel to the cross rail assembly). The end 582 of the second projection of the coupler 552 is shown within a cavity defined by the coupler 552 (in some examples, the coupler 552 can be double walled, similar to the frame member 501). The opening 571 is referred to as a "key pocket" in this view.

Figure 2D:
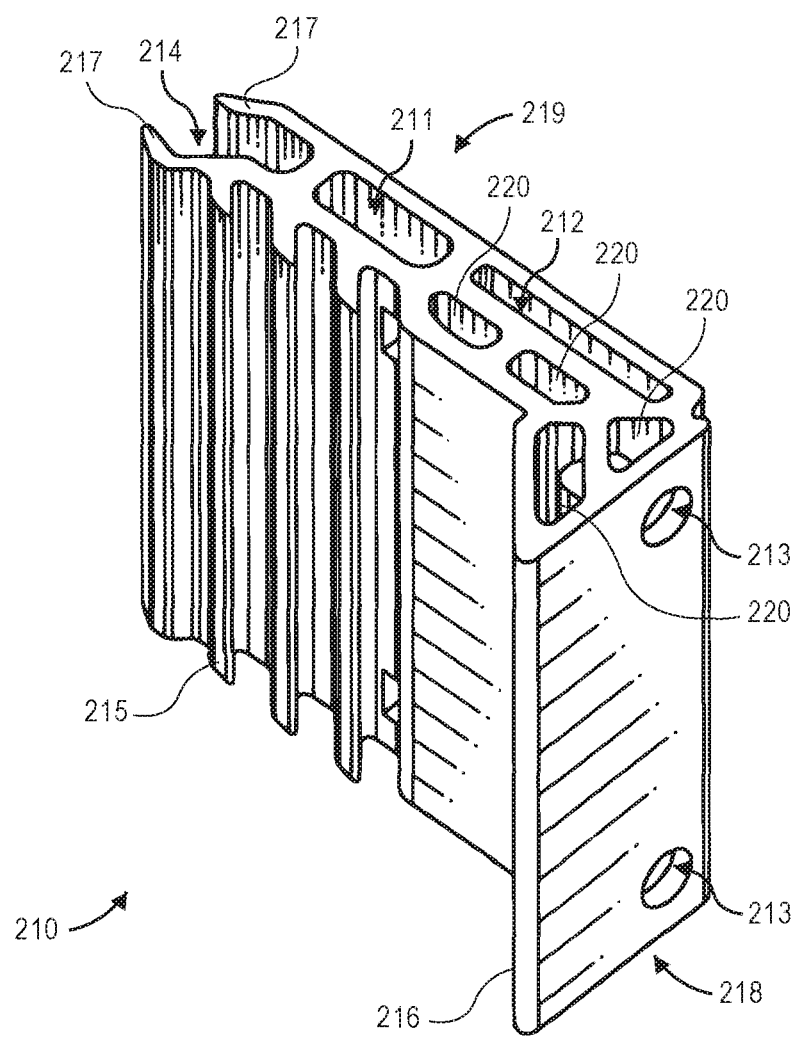
FIG. 2D illustrates a perspective view of a single-wall/double-wall adapter as can be employed, according to some embodiments.

In any embodiment described herein, the frame members can be single walled or double walled (similar to frame member 501 of FIG. 5B), and the cross rail assembly can be single walled or double walled. Also, in some embodiments of PV module having frame members and a cross rail assembly, the number of walls of the cross rail assembly need not be the same as the number of walls of the frame members. An adapter can be used to attach, say, a single walled cross rail assembly to a double walled frame member. FIG. 2D illustrates a perspective view of a single-wall/double-wall adapter as can be employed, according to some embodiments. This or any other feature of U.S. Provisional Application Ser. No. 62/651,035 can be used in any embodiment of a photovoltaic module with a cross rail assembly described herein. In particular, any features of this adapter can be employed on any coupler (e.g., grounding coupler) described herein, to provide a coupler (e.g., grounding coupler) to attach a single or double walled cross rail member to a double or single (respectively) walled frame.

In an embodiment, this connecting key 210 of FIG. 2D is a single-wall key with two connecting holes 213. In an embodiment, the single-wall key can be a single-wall aluminum key. Other materials, such as galvanized steel, or carbon laminate, or polymers, can also be used. Additionally, one connecting hole, or more than two connecting holes, such as 3, 4, 5, or more connecting holes, can be employed in embodiments. These connecting holes 213 can be used to secure the key to a single wall frame section during manufacture. In an example, the connecting holes can instead be referred to as screw holes, and screws can be used as connectors; however, the connecting holes can have other configurations, such a rod-hole combination, a pin-hole combination, a rivet-hole combination, a tox-hole combination, and a tab- or flange-slot/recess combination, and combinations thereof.

Also labelled in FIG. 2D are an open-end hollow 214, pinching ends 217, long key arm 219, optional key hollows 211, 212, 220, short key arm 218, and edge key arm 216. In some embodiments, the connecting key can have two short key arms, two long keys arms, three or more key arms (such as when connecting three or more frame sections together), a long key arm and a short key arm, and various permutations of these examples. As noted above, the connecting holes 213 can be threaded to accept screws and can also be sized or configured for other connectors, e.g., pins, rods, rivets, tox connectors, etc. Other connection techniques can be used, such as a flange-slot/recess combination or a tab-slot/recess combination.

In embodiments, connecting keys can join a cross rail assembly and frame sections at various angles that can include: 11.25°, 22.5°, 45°, 60°, 75°, 90°, 110°, 115°, 125°, 135°, and 180°. The frame sections can be made from various materials and can include a metal of sufficient rigidity. In embodiments, the connecting keys and frame sections can be galvanized or otherwise treated to resist weathering.

Figure 6:
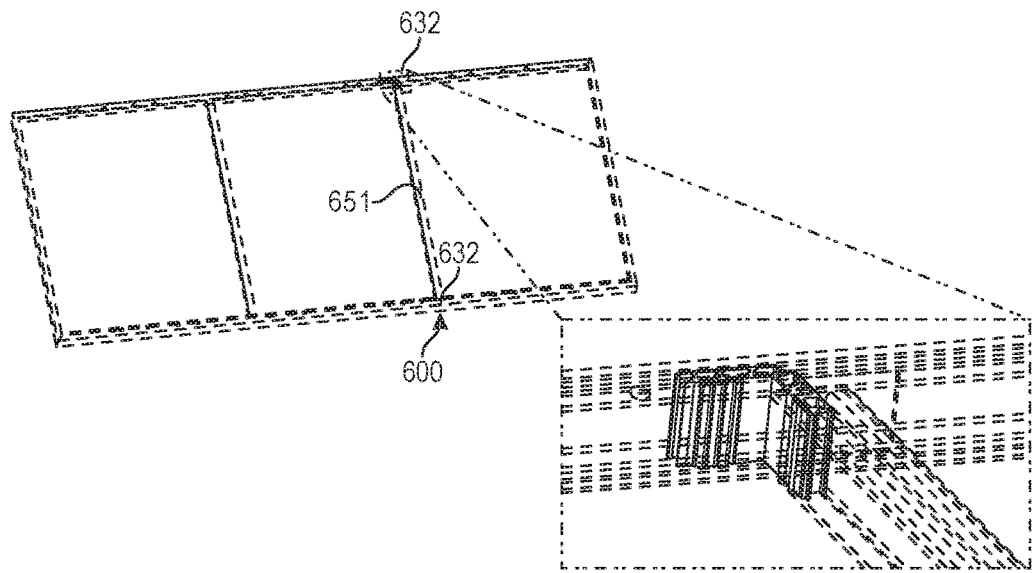
FIG. 6 illustrates a perspective view of a PV module with a cross rail assembly similar to the cross rail assembly of FIG. 4B, according to various embodiments.

FIG. 6 illustrates a perspective view of a PV module 600 with a cross rail assembly similar to the cross rail assembly of FIG. 4B, according to various embodiments. The PV module 600 includes a cross rail member 651, which can be similar to cross rail member 551 (FIGS. 5A-D). The cross rail member 651 can be electrically connected to the frame of the PV module 600 through the pair 632 of couplers, e.g., in some examples only through the pair 632 of couplers.

An exploded view of one of the couplers illustrates first, second, and third projections arranged in a T shape. For example, the cross rail assembly can be positioned perpendicular to the frame, as shown. In an example, one of the projections that define the channels can have a keyed end, similar to the end 582 (FIG. 5B).

In this example, the frame member is segmented. One of the projections is keyed and located in a cavity of one segment of the frame member. The other one of the projections is also keyed and located in a cavity of the other segment of the frame member. In other words, the coupler also couples the frame member segments together, besides coupling the cross rail member to the frame. The coupler can have a "metal to metal" contact, similar to the "metal to metal" contact described with respect to FIG. 5D.

Figure 7A:
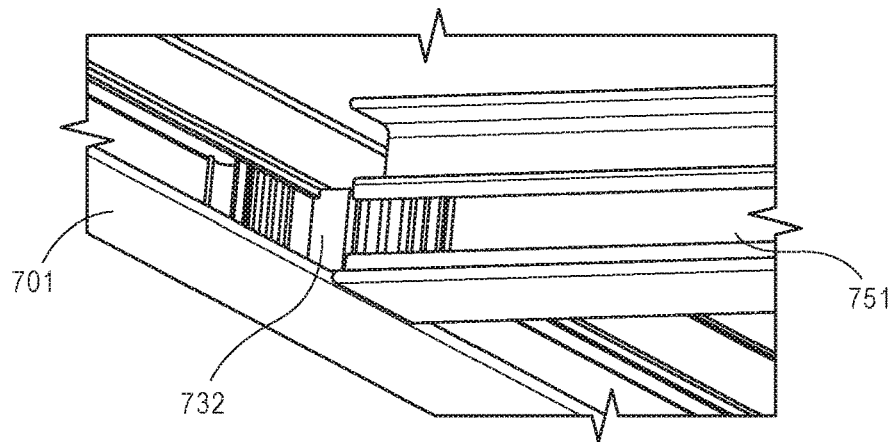
FIGS. 7A-C illustrate a partial bottom view of a PV module with a cross rail assembly similar to the cross rail assembly of FIG. 4C, according to various embodiments.
Figure 7B:
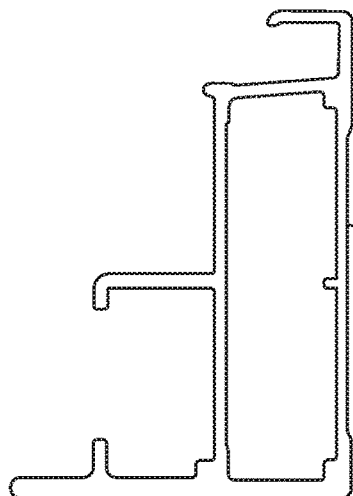
Figure 7C:
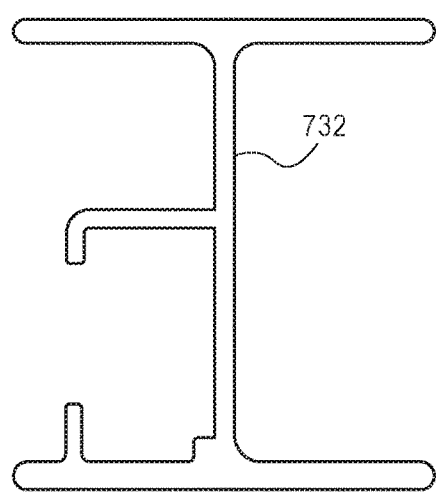

FIGS. 7A-C illustrate a partial bottom view of a PV module with a cross rail assembly similar to the cross rail assembly of FIG. 4C, according to various embodiments. This coupler 732 is referred to as a "short key." Again, the cross rail member 751 can be electrically connected to the frame through a pair of couplers, e.g., in some examples only through the pair of couplers. A "metal on metal" contact similar to the "metal on metal" contacts described previously, can be defined within the keyway and the corresponding region of the short key 732.

The short key 732 can be L or T shaped, and can include a projection that defines the channel (referred to in this example as DC cable pass through room) and includes a keyed end to mate with a cross rail keyway defined by the cross rail member 751. The other projection(s) can mate with a frame member keyway defined by the frame member 701. FIGS. 7B and 7C illustrate cross sections of the frame member 701 and the cross rail member 751, respectively. The keyways can be approximately half the height of the associated members (which can be the same height in this example), but can be other proportions in other examples. As shown by the cross sections, in this example the frame member 701 can be double walled and defining a keyway, and the cross rail member 751 can be an I structure and defining a keyway.

Also, the cavity defined by each keyway (to mate with the keyed regions of the coupler 732) can have dimensions greater than the openings in the keyways, as shown. A sidewall of the keyway defining this opening can be sheared off (in only a selected section of the keyway) during installation to dispose the keyed regions into the cavity. The keyed regions then can be slipped into the cavity, and a remaining section of the keyway (in which the sidewall is not sheared off) can secure the coupler into the members.

Figure 8A:
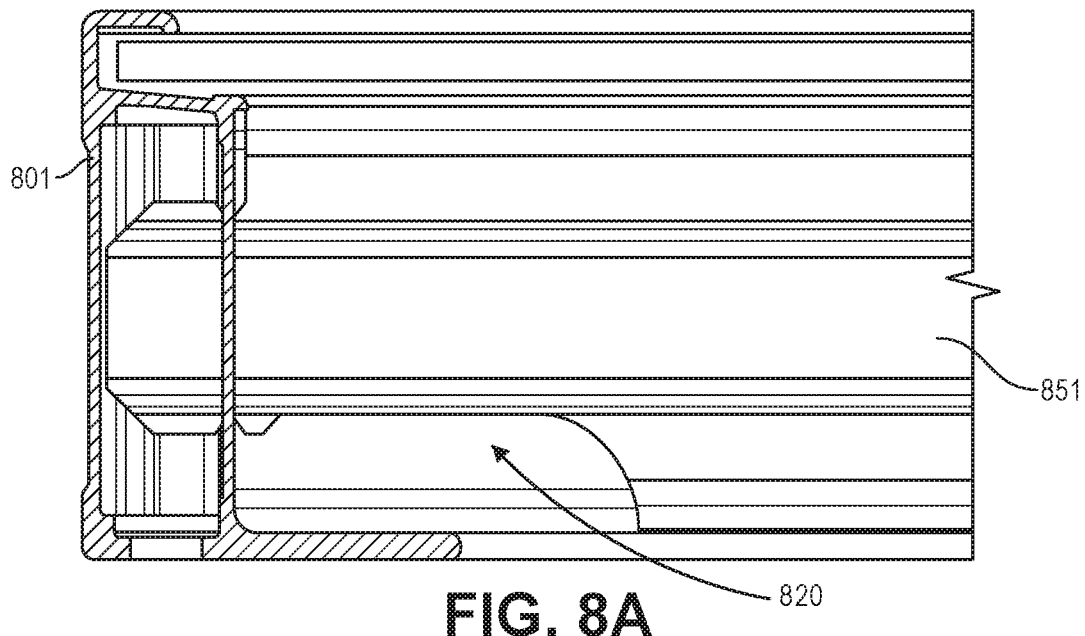
FIGS. 8A-B illustrate a partial cross section view of a PV module with a cross rail assembly similar to the cross rail assembly of FIG. 4D, according to various embodiments.
Figure 8B:
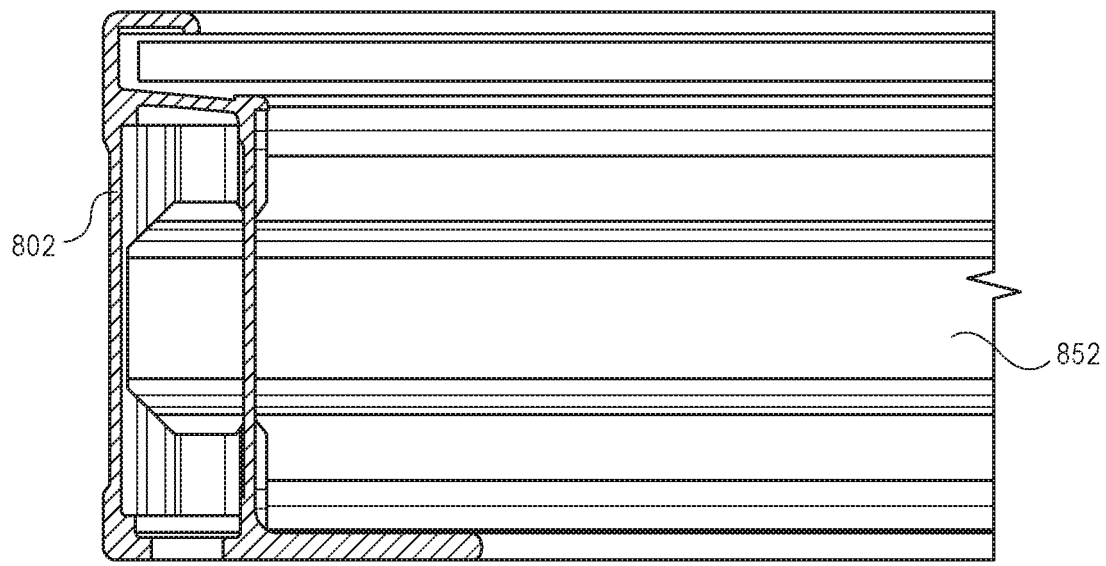

FIGS. 8A-B illustrate a partial cross section view of a PV module with a cross rail assembly similar to the cross rail assembly of FIG. 4D, according to various embodiments. In this view, a cross-sectional view of a frame portion and the cross rail member 851, is shown. In this example, the cross rail assembly includes a cross rail member 851 to make physical contact with the frame member 801. An end of the cross rail member 851 makes a metal on metal contact inside a cavity in the frame member 801. Also, the cross rail member 851 and the frame member 801 define a cabling channel (e.g., DC cable pass through).

Referring to FIG. 8B, the opening in the frame member 802 can be a spline. The cross section of the cross rail member 852 includes a distorted I shape (as shown, wherein opposite sides of the top and bottom of the I are non-parallel with the other sides of the top and bottom). This shape allows the cross rail member 852 to be turned for insertion into the spline shaped opening, and then twisted to lock into place.

Figure 8C:
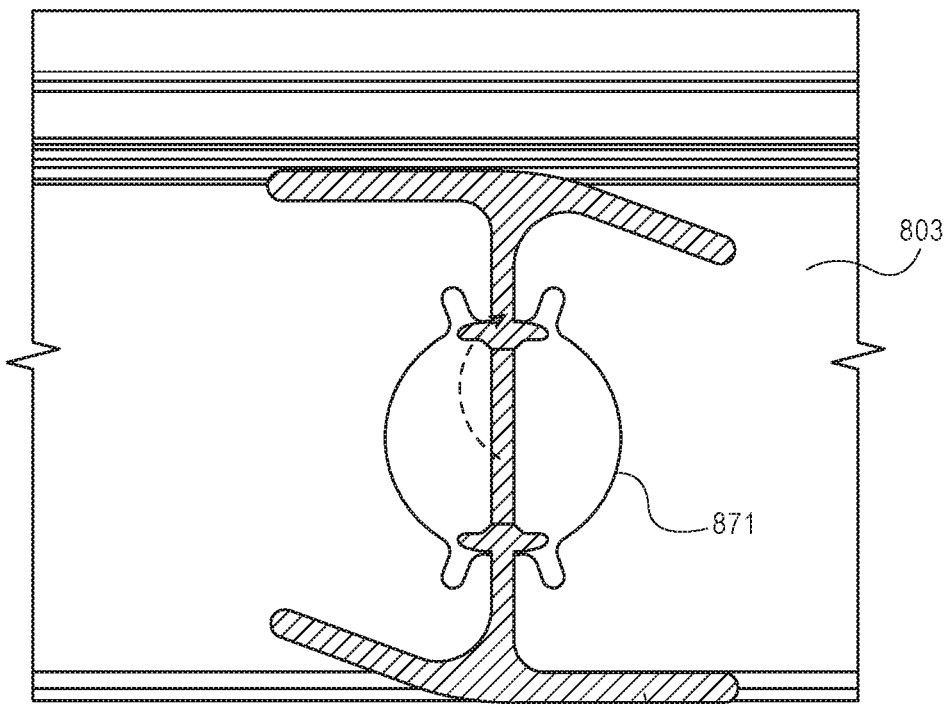
FIGS. 8C-D illustrate a partial cross section view of yet another PV module with a cross rail assembly similar in some respects to the cross rail assembly illustrated in FIGS. 8A-B.
Figure 8D:
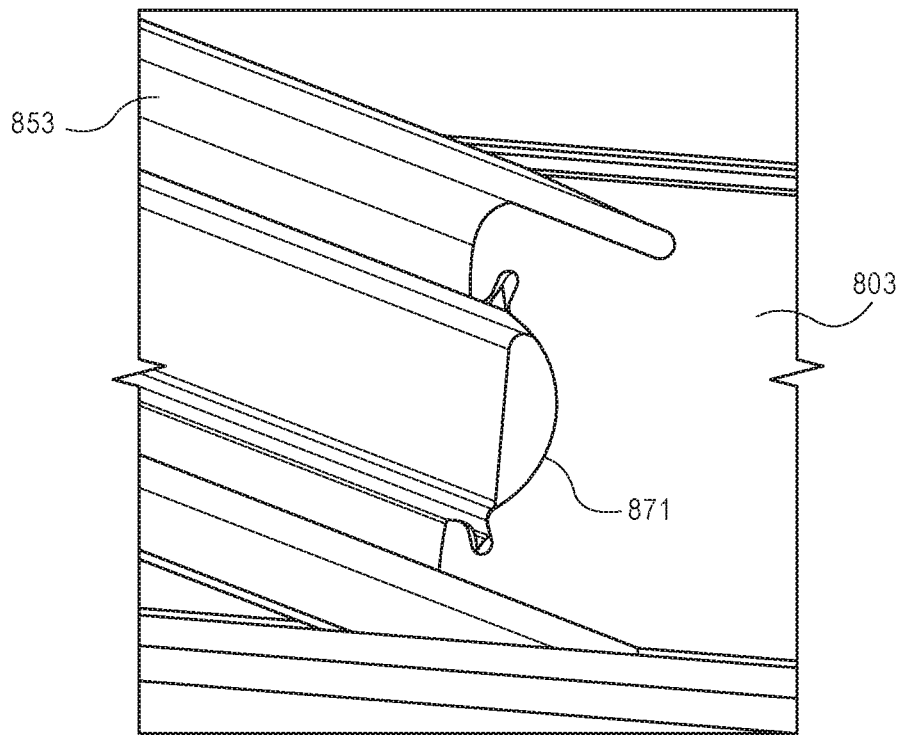

FIGS. 8C-D illustrate a partial cross section view of yet another PV module with a cross rail assembly. In this example, the cross rail member 853 does not define any channel. However, the cross rail member 853 still includes the metal on metal contact (e.g., with a lower resistivity surface of the frame member 803) and the locking features to mate with opening 871 in the frame member 803, and for these reasons the rivets required by some PV modules may not be required (due to the metal on metal contact on the non-anodized area and the locking feature).

Figure 9:
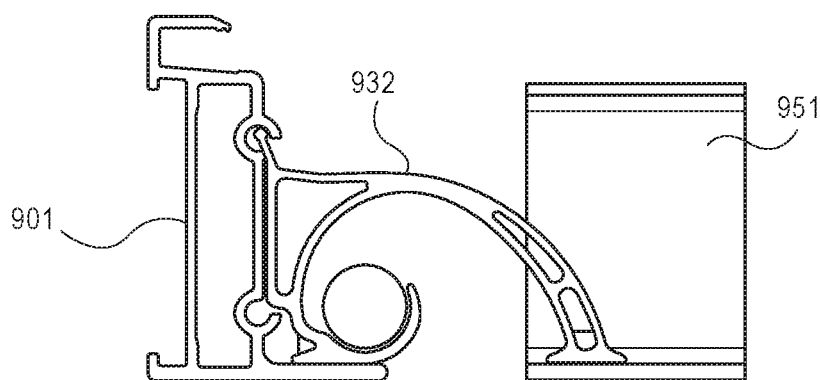
FIG. 9 illustrates a partial cross section view of a PV module with a cross rail assembly including a coupler (e.g. a spacer and fasteners to attach the spacer) to a frame member and a cross rail member, respectively, according to various embodiments.

FIG. 9 illustrates a perspective view of a partial cross section view of a PV module with a cross rail assembly including a coupler 932 (e.g. a spacer and fasteners to attach the spacer) to a frame member 901 and a cross rail member 951, respectively, according to various embodiments. In this example, the fasteners can puncture a surface (e.g., an anodized surface of bottom flanges) of the members 901 and 951 to provide continuity between the cross member 951 and the frame 901 (from the cross rail member 951, through a fastener, through the spacer, through the other fastener, to the frame member 901).

The spacer 932 can include a projection (such as a prong) to wedge fit the spacer into position, to hold the spacer 932 while the fasteners are installed. In this example, the projection mates with an approximately 270 degree circle formation on an interior wall of the frame member 902. In other examples, the frame member 902 need not include the circle formation and the projection can be longer and engage a backside of the PV laminate to wedge the spacer into position. In this example, the spacer 932 has an arithmetic spiral segment shape (similar to a nautilus), where an end for a smallest turning of the spiral segment defines a cable management feature (and another region of the spiral segment, such as the rest of the spiral segment, defines the channel). In other examples, the spacer can have any shape, such as a U shape (bottom of U facing PV laminate), and may or may not include a projection extending into the channel for cable management.

Figure 10A:
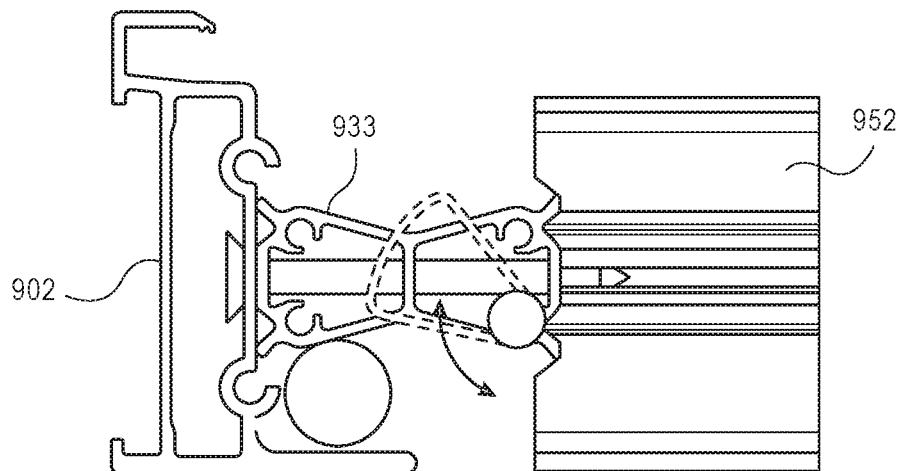
FIGS. 10A-B illustrate a partial cross section view of a PV module with a cross rail assembly including a coupler (e.g. a spacer and a fastener extending through a frame member, a spacer, and a cross rail member), according to various embodiments.
Figure 10B:
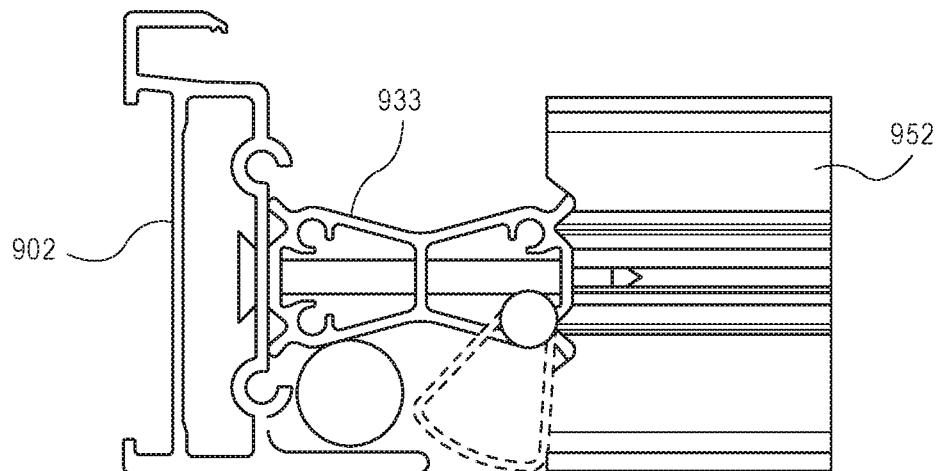

FIGS. 10A-B illustrates a partial cross section view of a PV module with a cross rail assembly including a coupler 933 (e.g. a spacer and a fastener extending through a frame member 902 and a cross rail member 952), according to various embodiments. In this example, the head of the fastener can provide metal on metal contact with an interior wall of the frame member 902, and also can puncture any anodized surface on an other side of the interior wall. The fastener can also puncture the end of the cross rail member 952.

The exterior wall of the frame member 902 can include an opening (not shown) sized for the head of the fastener to install the fastener from the outside of the PV module. The spacer can include small projections as illustrated to engage mating cavities on the end of the cross rail member 952, which can align the spacer for installation of the fastener into a predrilled hole between the mating cavities.

In this example, a spring can be coupled to the PV module as illustrated. In a released position, the spring can block access to the channel. The spring can be actuated to insert cabling into the channel, and then can spring back into the original position. The illustrated spring can be utilized as a cable management feature for the channel of any other PV module described herein. Other examples may note require a spring—the force of gravity may be sufficient to restore a cable management component (e.g., a closing tab) back to its initial state after cables are inserted.

Figure 11C:
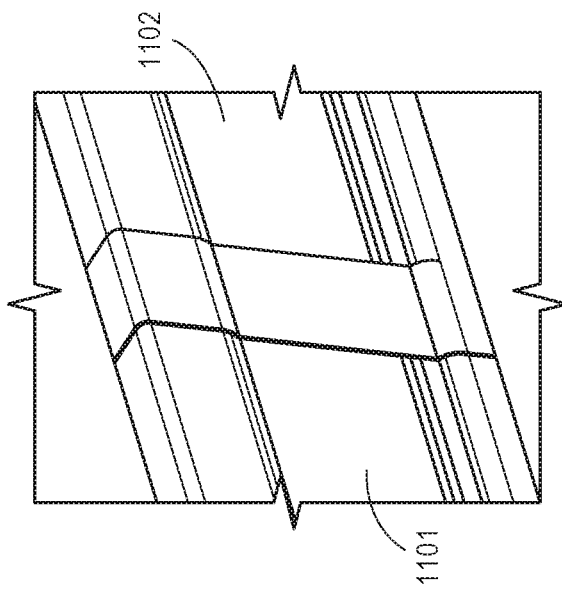
FIG. 11C illustrates a perspective view of a side of a frame of the PV module, according to various embodiments.
Figure 11B:
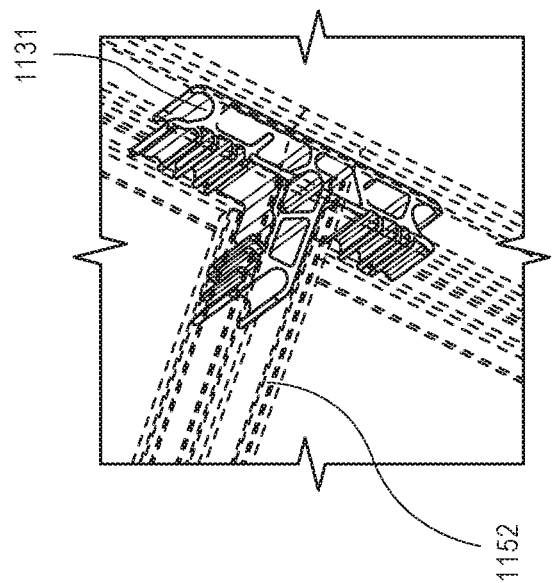
FIGS. 11A-B illustrate a front/back view and a partial bottom view, respectively, of a PV module similar to the PV module of FIG. 6.
Figure 11A:
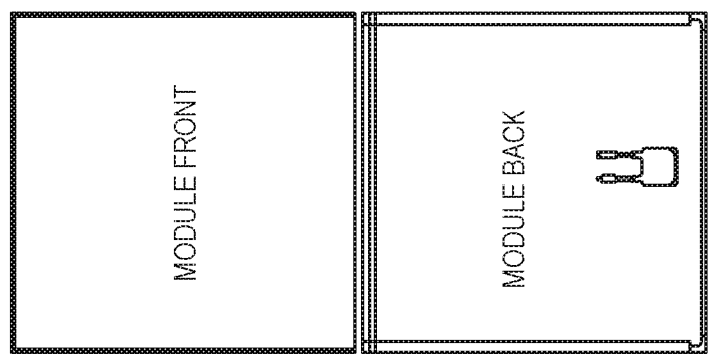

FIGS. 11A-B illustrate a PV module similar to the PV module of FIG. 6, according to various embodiments. As illustrated, the PV module can include frame member segments 1101 and 1102 joined end to end to form, say, long sides of the frame, as shown in FIG. 11C. The frame segments 1101 and 1102 can be joined to the cross rail member 1152 by the T shaped coupler 1131, shown in more detail in FIG. 12B. In some examples, a cover can be used as illustrated to protect the PV laminate and fill in any gaps between the frame segments 1101 and 1102 (although in some embodiments the ends of the frame segments 1101 and 1102 can be in physical content leaving substantially no gap). The channel and the coupler 1131 in the channel can be covered (e.g., protected from the elements) by the PV laminate.

FIGS. 12A-I illustrates a process of assembling a PV module similar to the PV module of FIGS. 5A-D, according to various embodiments. Short side frame members 1203 and 1204 can be placed on a backside of the PV laminate 1205 (or vice versa, e.g., PV laminate 1205 can be placed on the short side frames 1203 and 1204), as shown in FIGS. 12A-B. Couplers 1231 (e.g., L shaped couplers in this embodiment) can be inserted into an opening 1207 defined by interior sidewalls of long side frame members 1201 and 1202 (by moving the coupler 1231 toward the exterior sidewalls, through the opening 1207), as shown in FIG. 12C.

A keyed projection of the coupler 1231 can then be inserted into a cavity between the sidewalls by moving the coupler 1231 in an orthogonal direction (parallel with a length of the long side frame member 1201), as shown in FIGS. 12D-F. This can lock the coupler 1231 into place. A cross rail member 1251 can be slipped over a keyed end of the other projection of the coupler 1231 (this can be performed before inserting the coupler 1231 into the long side frame member 1201, in some examples).

With the couplers 1231 in place, the assembly of the long side frame members 1201 and 1202, the couplers 1231, and the cross rail members 1251 can be placed on the backside of the PV laminate 1205. This can include initially inserting corner keys 1299 into the short side frame members (as shown in FIGS. 12G-I for frame member 1204), and then slipping the long side members 1201 and 1202 over the other projections of the corner keys 1299. The PV module can then be transported to an installation site, where an installer can string cable through the channels.

Figure 13:
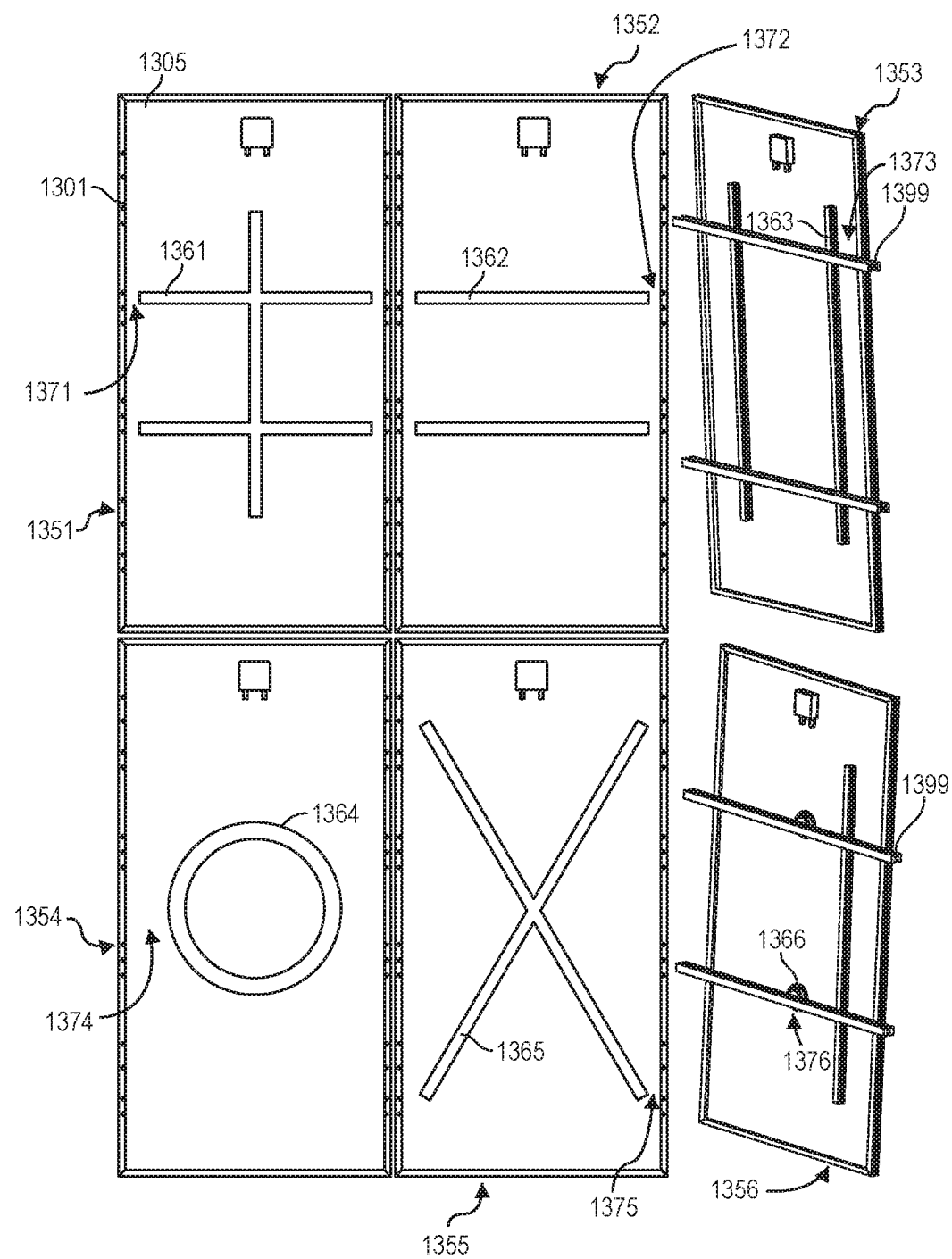
FIG. 13 illustrates a bottom view of six different PV assemblies having non-conductive cross rail assemblies, according to various embodiments.

FIG. 13 illustrates a bottom view of six different PV assemblies 1351, 1352, 1353, 1354, 1355, and 1356 having non-conductive cross rail assemblies 1361, 1362, 1363, 1364, 1365, and 1366, respectively, according to various embodiments. Non-conductive cross rail assemblies 1361, 1362, 1363, 1364, 1365, and 1366 can be manufactured using any known molding, casting, and/or forming processes. In some embodiments, the non-conductive cross rail assemblies 1361, 1362, 1363, 1364, 1365, and 1366 can include non-extruded components (e.g., only non-extruded components). In some embodiments, non-conductive cross rail assemblies 1361, 1362, 1363, 1364, 1365, and 1366 can include plastic.

Non-conductive cross rail assemblies 1361, 1362, 1363, 1364, 1365, and 1366 can limit the bending under load of the PV laminate 1305 by stiffening the PV laminate 1305, e.g., each can shorten the distance from two frame-supported parts of the PV laminate 1305, e.g., can create additional load paths between the PV laminate 1305 and a mounting system component, such as mounting rails 1399. In some embodiments, non-conductive cross rail assemblies 1361, 1362, 1363, 1364, 1365, and 1366 can have a height greater than a selected value (e.g., half of the distance between the back side of the PV laminate 1305 and a plane of a bottom of the frame) to provide this stiffening. Non-conductive cross rail assemblies 1361, 1362, 1363, 1364, 1365, and 1366 can be attached to a backsheet of the PV laminate 1305 using, for example, an adhesive similar to other embodiments of cross rail assemblies described herein.

Also, any of the non-conductive cross rail assemblies 1361, 1362, 1363, 1364, 1365, and 1366 can contact mounting system components, such as mounting rails 1399. In some embodiments, any of the non-conductive cross rail assemblies 1361, 1362, 1363, 1364, 1365, and 1366 can distribute contact force from mounting system components through a greater region of the PV laminate 1305. Other embodiments of a non-conductive cross rail assembly can have any shape to transfer the load between mounting system components and the PV laminate 1305 laminate in downforce.

The non-conductive cross rail assemblies 1361, 1362, 1363, 1364, 1365, and 1366 can define cabling gaps 1371, 1372, 1373, 1374, 1375, and 1376 with the frame 1301, e.g., with long side members of the frame 1301. In the illustrated embodiments, the cabling gaps 1371, 1372, 1373, 1374, 1375, and 1376 are also defined by a backside of the PV laminate 1305. In other embodiments, a conductive cross rail assembly can have any of the illustrated shapes of non-conductive cross rail assemblies 1361, 1362, 1363, 1364, 1365, and 1366 and additionally can include a section similar to section 311 (FIG. 3) and/or can include a separate component (such as any conductive spacer described herein) to electrically couple the conductive cross rail assembly to a frame of the PV assembly. In these embodiments, the conductive cross rail assembly and/or the additional component can define a cabling channel with the frame. Also, conductive cross rail assemblies can make contact with a conductive mounting rail (similar to mounting rail 1399) provide form an electrical path (e.g., the only electrical path) between a frame of the PV module and the conductive mounting rail.

Shapes of any cross rail assemblies according to embodiments disclosed herein can be significantly different than a "bar" shape of the cross rail member illustrated in FIG. 2A. For instance, such a shape may or may not be defined by elongated members at all or not at all, e.g., a cross rail assembly similar to non-conductive cross rail assembly 1366 can include a shape not defined by any elongated members (e.g., round). Also, any cross rail member can include a round core and one or more elongated projections extending from the round core (which may or may not be parallel with any members of the frame, and in the case of more than one elongated projection may not be parallel with another one of the elongated projections). Also, some shapes can have elongated members that are not parallel with any members of the frame, e.g., a cross rail assembly similar to non-conductive cross rail assemblies 1364 and 1365. Also, some shapes can include elongated projections extending from a point similar to non-conductive cross rail assembly 1361 (such as a double cross shape with two of such points). In non-conductive cross rail assembly 1361 with elongated projections, at least one of the elongated projections is non-parallel (e.g., orthogonal) with another one of the elongated projections).

Figure 14A:
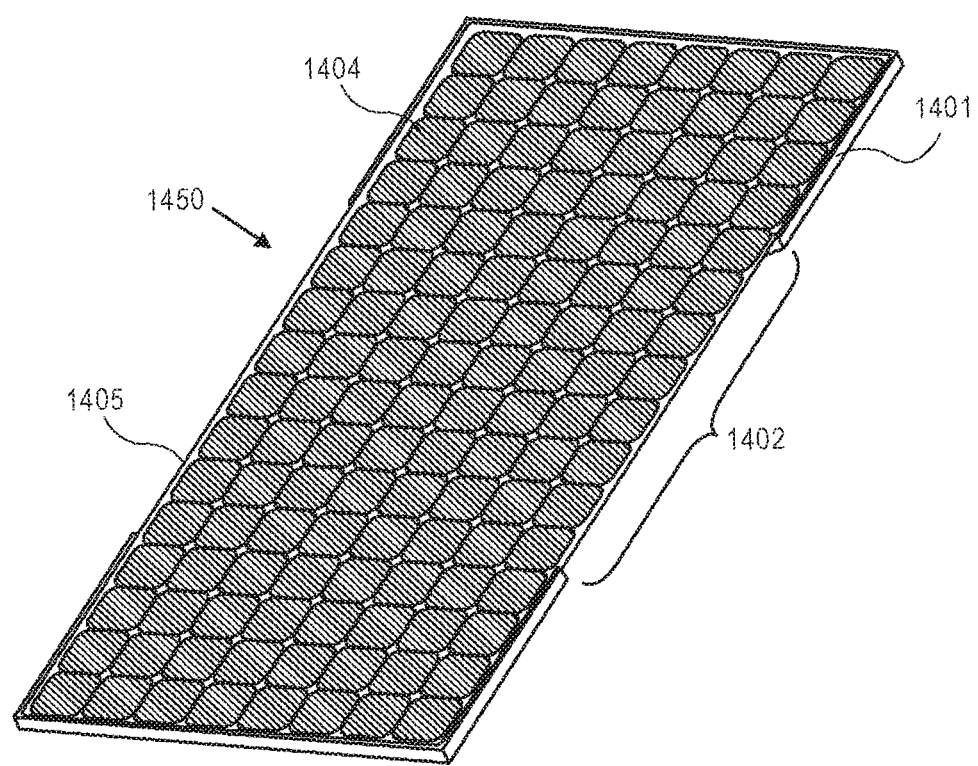
FIG. 14A illustrate a plan view of a photovoltaic assembly 1450, respectively, according to various embodiments.
Figures 14B, 14C, 14D, 14E:
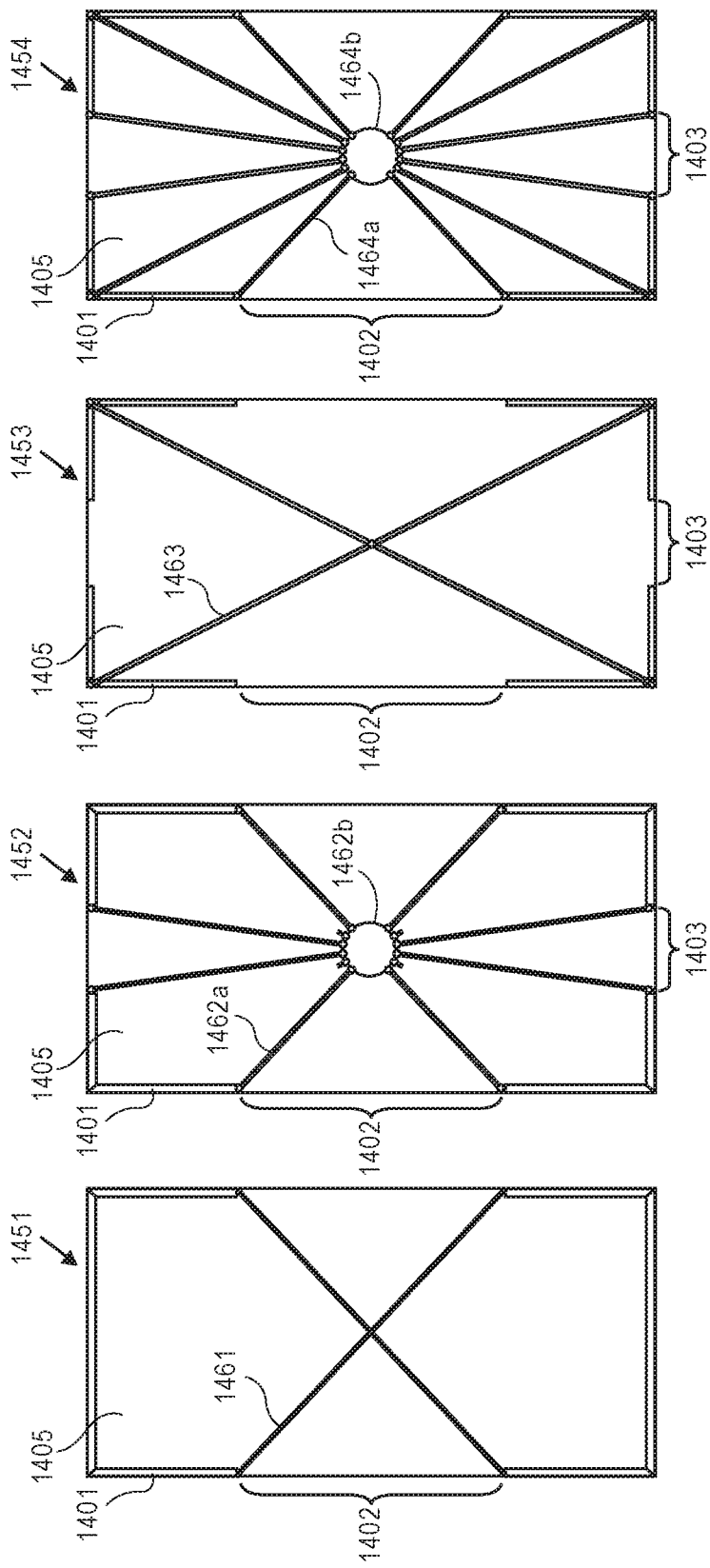
FIGS. 14B-E illustrates a bottom view of four different PV assemblies having cross rail assemblies, respectively, according to various embodiments.

FIGS. 14A-14C include optional PV assemblies 1451, 1452, 1453, 1454, and 1455 having cross rail assemblies 1461, 1462*a* 1462*b*, 1463, 1464*a*, and 1464*b*, respectively. The PV assemblies 1451, 1452, 1453, 1454, and 1455 and cross rail assemblies 1461, 1462*a* 1462*b*, 1463, 1464*a*, and 1464*b* can provide comparable structural support to a full frame, in reference to FIG. 1. In an example, the cross rail assemblies 1461, 1462*a* 1462*b*, 1463, 1464*a*, and 1464*b* can provide structural support that allow for the use of partial frames, e.g., frames that are not continuous and/or include gaps between frame portions. Such PV assemblies 1451, 1452, 1453, 1454, and 1455 and cross rail assemblies 1461, 1462*a* 1462*b*, 1463, 1464*a*, and 1464*b* can provide substantial cost reduction in contrast to the use of full frames while providing comparable structural integrity you would expect in a full frame.

FIG. 14A illustrate a plan view of a photovoltaic assembly 1450, respectively, according to various embodiments. As shown, the photovoltaic assembly 1450 can include a partial frame 1401, a plurality of solar cells 1404, a laminate 1405 and a gap portion 1402 between partial frame portions 1404. The photovoltaic assembly 1450 can represent a plan view for the PV assemblies 1451, 1452, 1453, 1454, and 1455 described in FIG. 14B.

FIGS. 14B-E illustrates a bottom view of four different PV assemblies 1451 (FIG. 14B), 1452 (FIG. 14C), 1453 (FIG. 14D), and 1454 (FIG. 4E) having cross rail assemblies 1461, 1462*a* 1462*b*, 1463, 1464*a*, and 1464*b*, respectively, according to various embodiments. Referring to PV assembly 1451, the cross rail assembly 1461 can include a cross structure which can connect at end portions of a partial frame 1401, the partial frame 1401 including gaps 1402 between separate partial frames. Referring to PV assembly 1452, the cross rail assembly 1462a, 1462b can include support portions 1462a and a central support portion 1462b, where the support portion can be connected to end portions of a partial frame 1401 and the central portion 1462b can connect to all the support portions 1462a together. Referring to PV assembly 1453, the cross rail assembly 1463 can include a cross structure which can connect at corners of a partial frame 1401, where the partial frame can include gaps 1402, 1403. Referring to PV assembly 1454, the cross rail assembly 1464a, 1464b can include support portions 1464a and a central support portion 1464b, where the support portion can be connected to end portions and corner portions of a partial frame 1401 and the central portion 1462b can connect to the support portions 1462a together. Also, the partial frame 1401 can include gaps 1401 at long sides of the PV assembly and/or can include gaps 1403 at short sides of the PV assembly.

Referring again to FIG. 14B, the cross rail assemblies 1461, 1462a 1462b, 1463, 1464a, and 1464b, can be manufactured using any known molding, casting, and/or forming processes. In some embodiments, the cross rail assemblies 1461, 1462a 1462b, 1463, 1464a, and 1464b, can include non-extruded components (e.g., only non-extruded components). In some embodiments, the cross rail assemblies 1461, 1462a 1462b, 1463, 1464a, and 1464b, can include plastic. In an embodiment, the cross rail assemblies 1461, 1462a 1462b, 1463, 1464a, and 1464b, can limit the bending under load of the PV laminate 1405 by stiffening the PV laminate 1405, e.g., each can create additional load paths between the PV laminate 1405 and a mounting system component, such as mounting rails 1399 of FIG. 13. In one example, the cross rail assemblies 1461, 1462a 1462b, 1463, 1464a, and 1464b can be non-conductive, e.g., include non-conductive materials. In another example, the 1461, 1462a 1462b, 1463, 1464a, and 1464b can be conductive, e.g., include conductive materials.

Figure 14F:
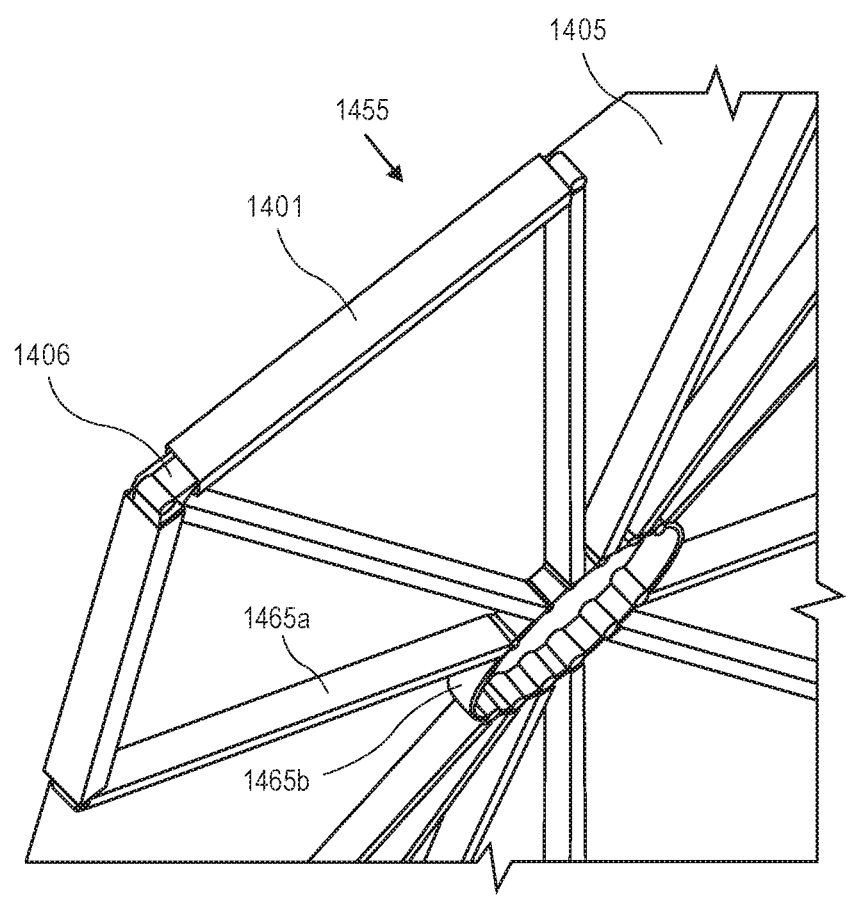
FIG. 14F illustrates a perspective view of a bottom of another PV assembly having a cross rail assembly, according to various embodiments.

FIG. 14F, illustrates a perspective view of the PV assembly 1455, according to various embodiments. In an example, the cross rail assembly can include support portions 1465a and a central support portion 1465b. In an example, the support portion 1465a can be connected to end portions and corner portions of a partial frame 1401 (for PV laminate 1405) and the central portion 1465b can connect to the support portions 1465a together, as shown for clarity.

Figure 15:
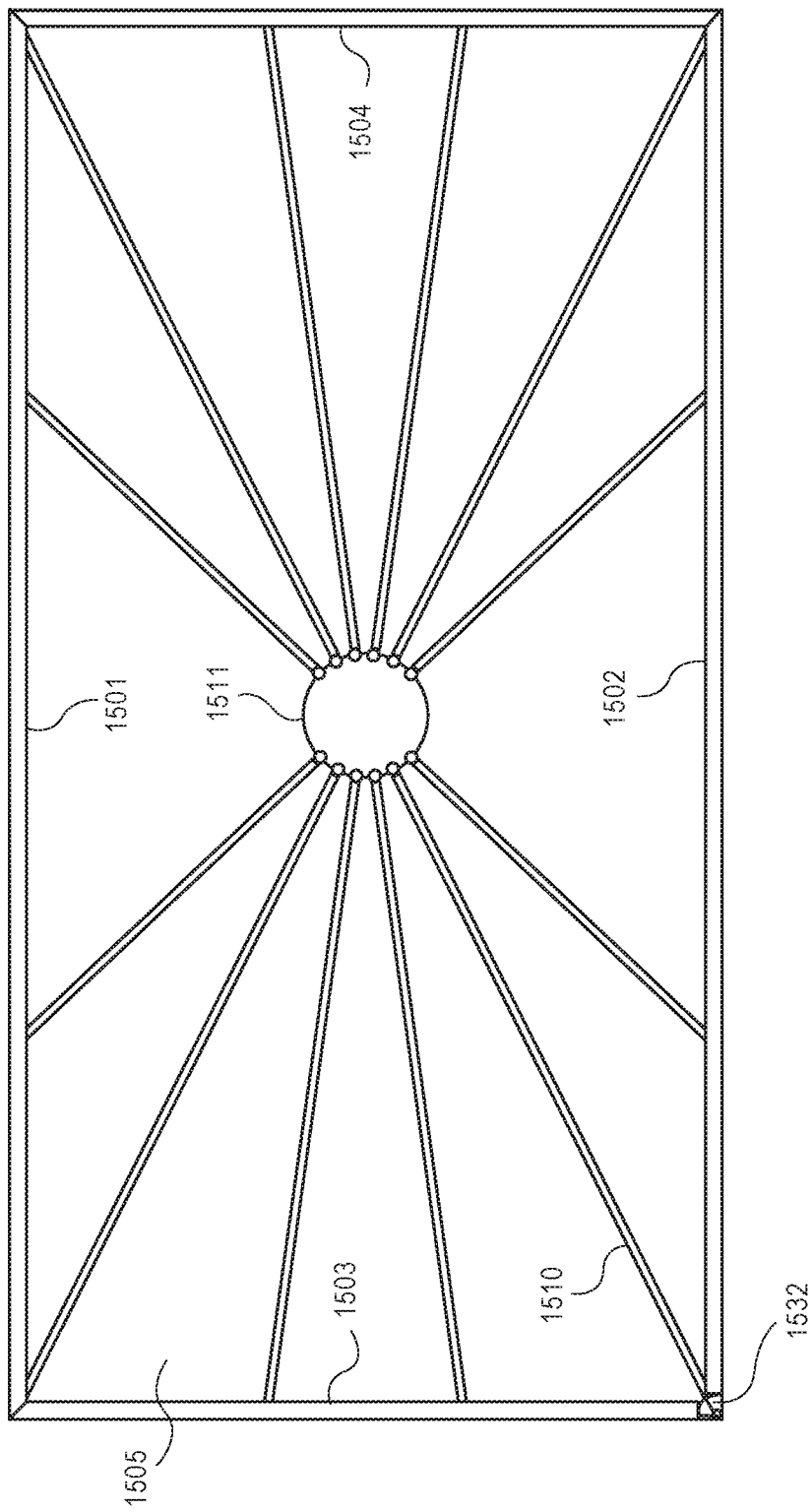
FIG. 15 illustrates a bottom view of another PV assembly having a cross rail assembly in which only a subset of the cross rail members is attached to the frame via a grounding coupler, according to various embodiments.

FIG. 15 illustrates a bottom view of another PV assembly having a conductive cross rail assembly in which only a subset of the cross rail members is attached to the frame via a grounding coupler, according to various embodiments. The frame of the PV assembly includes a frame member 1501, a frame member 1502, a frame member 1503, and a frame member 1504. The cross rail assembly includes a number of cross rail members. A grounding coupler 1532, similar to any grounding coupler, keyed adaptor, or the like, described in any example here, electrically couples an individual cross rail member 1510 of the cross rail members to the frame. In this example, the grounding coupler 1531 attaches the cross rail member to a corner defined by frame members 1502 and 1503 (e.g., tethered to one or more frame members, such as a corner defined by frame members), but in other examples a grounding coupler for the individual cross rail member may attach the individual cross rail member to one of the frame members 1501-1504.

The other remaining cross rail members may be electrically coupled to the frame only through the individual cross rail member 1510 and its grounding coupler 1532. The other remaining cross rail members may not have their own couplers (e.g., the other remaining cross rail members may be "untethered" to the frame members and instead adhered to the PV laminate 1505, similar to how any non-conductive cross rail members described herein may be adhered to a PV laminate). In this example, a circular cross rail member 1511 electrically couples the other cross rail members to the individual cross rail member 1510. Any of the cross rail members (including cross rail member 1510 and/or the circular cross rail member 1511) may be adhered to the PV laminate 1505, similar to how any non-conductive cross rail members described herein may be adhered to a PV laminate.

EXAMPLES

Example 1 is a photovoltaic (PV) module, comprising: a PV laminate having a front side, a back side, and a plurality of solar cells encapsulated between the front side and the back side; a frame, wherein a perimeter of the PV laminate is mounted on the frame; a cross rail assembly to provide structural rigidity to the PV laminate and the frame, the cross rail assembly extending from a first member of the frame to a second member of the frame, the cross rail assembly grounded to the frame and having a first side facing the back side of the PV laminate and a second opposite side; and a cabling channel defined by: an end of a member of the cross rail assembly and a grounding coupler to attach the end of the member of the cross rail assembly to one of the first and second members of the frame, or a first section of a plurality of sections of the cross rail assembly, wherein a distance between the first side of the cross rail assembly and the second side of the cross rail assembly in the first section is less than a distance between the first side of the cross rail assembly and the second side of the cross rail assembly in a second different section of the plurality of sections of the cross rail assembly.

Example 2 includes the subject matter of example 1 or any other example herein, wherein the one of the first or second members of the frame includes a cavity defined by interior one of a plurality of sidewalls of the one of the first or second members, and wherein the grounding coupler extends through an opening formed in the interior sidewall.

Example 3 includes the subject matter of example 2 or any other example herein, wherein the grounding coupler includes first and second projections arranged in an L-shape, the first projection located in the cavity and the second projection defining the cabling channel. While the first and second projections may be arranged in an L-shape in some examples, in other examples the first and second projections may be arranged along intersecting lines that form any angle (e.g., any obtuse angle, say less than 160 degrees in some examples, or an any acute angle, say greater than 70 degrees in some examples).

Example 4 includes the subject matter of example 3 or any other example herein, wherein the second projection is fastened to the end of the member of the cross rail assembly.

Example 5 includes the subject matter of example 3 or any other example herein, wherein the first projection is keyed and, and wherein the cavity comprises a key pocket.

Example 6 includes the subject matter of example 2 or any other example herein, wherein the one of the first or second members of the frame is segmented into segments, wherein the cavity is defined by ends of the segments, and wherein the grounding coupler includes first, second, and third projections arranged in a T-shape, the first and second projections located in the cavity and the third projection defining the cabling channel. While the grounding coupler may be arranged in a T-shape in some examples, in other example angles any two projections can be right angles, any acute angle, any obtuse angle, etc.

Example 7 includes the subject matter of example 6 or any other example herein, wherein the first and second projections are keyed, and wherein the cavity comprises a plurality of openings to make with the first and second projections.

Example 8 includes the subject matter of example 6 or any other example herein, wherein the third projection is fastened to the end of the member of the cross rail assembly.

Example 9 includes the subject matter of example 6 or any other example herein, wherein a first end section of the third projection is keyed, and wherein the first end section of the third projection is located in a keyway formed on an end of the cross rail, and wherein a second different section of the third projection defines the cabling channel.

Example 10 includes the subject matter of example 1 or any other example herein, wherein the one of the first or second members of the frame includes a keyway defining an opening to receive a keyed projection of the grounding coupler, and wherein the keyed projection of grounding coupler extends through a cavity defined by the keyway.

Example 11 includes the subject matter of example 1 or any other example herein, further comprising a keyed projection formed on the end of the member of the cross rail assembly, wherein the keyed projection is located in a cavity defined by interior sidewall of the one of the first or second members and an exterior sidewall of the one of the first or second members.

Example 12 includes the subject matter of example 11 or any other example herein, wherein the interior wall includes a spline opening having a first region one or more projections defining one or more second regions, respectively, and wherein the keyed projection is located in only the first region of the spline opening.

Example 13 includes the subject matter of example 1 or any other example herein, wherein the grounding coupler a conductive spacer and one or more conductive fasteners to form an electrical path that includes the member of the cross rail assembly and the frame.

Example 14 includes the subject matter of example 13 or any other example herein, wherein the one or more fasteners comprises a first fastener and a second fastener to attach the conductive spacer to the end of the member of the cross rail assembly and the frame, respectively.

Example 15 includes the subject matter of example 13 or any other example herein, wherein the one or more fasteners comprises a fastener having a length that is longer than a length of the conductive spacer, wherein the fastener extends through an opening in the frame, an opening in the space, and an opening in an end of the member of the cross rail assembly.

Example 16 includes the subject matter of example 1 or any other example herein, wherein the cabling channel is defined by the first section of the cross rail assembly and one of the first and second members of the frame.

Example 17 includes the subject matter of example 1 or any other example herein, wherein the cabling channel comprise a first cabling channel, the member of the cross rail assembly comprises a first member of the cross rail assembly, the grounding coupler comprises a first grounding coupler, the plurality of sections of the cross rail assembly comprises a first plurality of sections of the cross rail assembly, and wherein the PV module further comprises: one or more second cabling channels defined by: an end of one or more second members of the cross rail assembly, respectively, and one or more second grounding couplers to attach one or more ends of the one or more second members of the cross rail assembly, respectively, to one of the first and second members of the frame, respectively, or one or more first sections of one or more second plurality of sections of the cross rail assembly, respectively, wherein a distance between the first side of the cross rail assembly and the second side of the cross rail assembly in the one or more first section of the one or more second plurality of sections is less than a distance between the first side of the cross rail assembly and the second side of the cross rail assembly in one or more second different sections of the second plurality of sections of the cross rail assembly, respectively.

Example 18 includes the subject matter of example 1 or any other example herein, wherein the first member of the frame is of a first edge of the PV module and the second member of the frame is of a second opposite edge of the PV module.

Example 19 includes the subject matter of example 18 or any other example herein, wherein the frame comprises a rectangular frame, and wherein the first and second members are longer than third and fourth members of the rectangular frame.

Example 20 includes the subject matter of example 1 or any other example herein, wherein the cross rail assembly is in contact with the back side of the PV laminate.

Example 21 includes the subject matter of example 20 or any other example herein, wherein the member of the cross rail assembly is adhered to the back side of the PV laminate.

Example 22 includes the subject matter of example 1 or any other example herein, wherein the perimeter of the PV panel contacts a first side of the first and second members of the frame, and wherein a distance between the first side of the first and second members of the frame and a second opposite side of the first and second members of the frame is the same as the distance between the first side of the cross rail assembly and the second side of the cross rail assembly in a second different section of the plurality of sections of the cross rail assembly.

Example 23 includes the subject matter of example 1 or any other example herein, wherein the second section of the cross rail assembly is arrangable to form wall with a mounting rail of a mounting frame, and wherein the first section of the cross rail assembly and a corresponding location on the mounting rail defines a cabling tunnel.

Example 24 is an apparatus, comprising: a frame to receive a perimeter of a backside of a photovoltaic (PV) laminate; one or more cross rail members provide structural rigidity to the frame; and one or more pairs of couplers coupled to the frame, each coupler of the pair including a first section to define a channel and a second keyed section inserted into a different end of a corresponding cross rail member of the one or more cross rail members; wherein each cross rail member is electrically connected to the frame only through the couplers of a corresponding one of the one or more pairs.

Example 25 includes the subject matter of example 24 or any other example herein, wherein a side of the one or more cross rail members is arranged in a same plane as a side of the frame to receive a perimeter of a backside of a photovoltaic (PV) laminate.

Example 26 includes the subject matter of example 25 or any other example herein, wherein an opposite side of the one or more cross rail members is arranged in a same place as an opposite side of the frame.

Example 27 includes the subject matter of example 26 or any other example herein, wherein the frame comprises four members, at least one of the frame members includes plural segments, and wherein each segment of the segments includes an end defining one of a cavity or a projection to mate with the other of a cavity or projection of the coupler, wherein a count of the one or more pair of couplers is equal to N, and wherein a count of the segments is N+1.

Example 28 is an apparatus for use in a photovoltaic (PV) assembly, the PV assembly including one or more mounting rails and a PV module including a frame and a PV laminate having a front side, a back side, and a plurality of solar cells encapsulated between the front side and the back side, wherein a perimeter of the PV laminate is mounted on the frame, the apparatus further comprising: one or more cross rail assemblies to provide structural rigidity to the PV laminate and the frame, each cross rail assembly extending from a first member the frame to a second member of the frame, the cross rail assemblies grounded to the frame and having a first side facing the back side of the PV laminate and a second opposite side; wherein at least one of the one or more cross rail assemblies includes one or more first sections having one or more heights that are less than height(s) of remaining sections of the at least one cross rail assembly, wherein the one or more first sections of the at least one cross rail assembly define one or more channels.

Example 29 includes the subject matter of example 28 or any other example herein, wherein the one or more channels comprise one or more channels when the at least one cross rail assembly is mounted over, and in parallel with, a mounting rail of the one or more mounting rails.

Example 30 includes the subject matter of example 29 or any other example herein, wherein the one or more cross rail assemblies comprise one or more cross rail members, respectively, wherein the one or more cross rail assemblies further include one or more pairs of couplers, each coupler of the pair attached to a different end of a corresponding cross rail member of the one or more cross rail members.

Example 31 is a photovoltaic (PV) module, comprising: a PV laminate having a front side, a back side, and a plurality of solar cells encapsulated between the front side and the back side; a frame, wherein a perimeter of the PV laminate is mounted on the frame; a non-conductive cross rail assembly to provide structural rigidity to the PV laminate and the frame, the non-conductive cross rail assembly extending from a first member the frame to a second member of the frame, the non-conductive cross rail assembly having a first side adhered to a back side of the PV laminate and a second opposite side to make contact with one or more mounting rails; and a cabling gap defined by the non-conductive cross rail assembly, the first or second member of the frame, and the back side of the PV laminate.

Example 32 includes the subject matter of example 31 or any other example herein, wherein the cabling gap is further defined by an end of an elongated member of the non-conductive cross rail assembly, wherein the elongated member is non-parallel and non-orthogonal with the first and second members of the frame.

Example 33 includes the subject matter of example 31 or any other example herein, wherein the non-conductive cross rail assembly includes a round core centered on a center of the backside of the PV laminate.

Example 34 includes the subject matter of example 31 or any other example herein, wherein the non-conductive cross rail assembly includes one or more projections extending from the round core.

Example 35 includes the subject matter of example 35 or any other example herein, wherein the non-conductive cross rail assembly includes a first elongated projection that is non-parallel with a second elongated projection of the non-conductive cross rail assembly.

The above disclosure and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase(s) "means for" or "step for," respectively.

What is claimed is:

1. A system comprising:
    a conductive frame of a photovoltaic (PV) module, the conductive frame comprising a first side frame member, the first side frame member having two ends and a middle portion between the two ends, and the conductive frame further comprising a conductive cross rail member; and
    an elongated grounding coupler comprising:
        a first end, a second end, a length between the first end and the second end, and a first keyed section at the first end of the coupler, the first keyed section configured to insert into an opening defined in the middle portion of the conductive frame of the photovoltaic (PV) module; and
        a second section at the second end of the elongated grounding coupler, the second section configured to mate with an end of the conductive cross rail member of the PV module; and wherein the conductive cross rail member is shaped as an I beam and has at least one flange projecting at an acute angle from the middle portion of the cross-rail member.

2. The system of claim 1, wherein the length comprises a slender length to define a cabling channel with the conductive frame and the conductive cross rail member, wherein a first sidewall of the cabling channel is defined by the first side frame member, a second sidewall of the cabling channel is defined by the end of the cross rail member, and a bottom of the cabling channel is defined by the length.

3. The system of claim 1, wherein the second section comprises a single wall key.

4. The system of claim 1, wherein the first keyed section is arranged to insert into a spline opening, wherein the opening defined by the middle portion of the first side frame member of the conductive frame comprises the spline opening.

5. The system of claim 1, wherein the opening defined by the middle portion of the first side frame member of the conductive frame is shaped as a splined hole.

6. A system comprising:
a conductive frame of a photovoltaic (PV) module, the conductive frame comprising a double-wall frame member, the double-wall frame member having two ends and a middle portion between the two ends, and the conductive frame further comprising a conductive cross rail member; and
an elongated grounding coupler comprising:
a first end, a second end, a length between the first end and the second end, and a first keyed section at the first end, the first keyed section configured to insert into an opening defined by the middle portion of the double-wall frame member; and
a second section at the second end, the second section configured to mate with an end of the conductive cross rail member of the PV module; and wherein the conductive cross rail member is shaped as an I beam and has at least one flange projecting at an acute angle from a central web of the cross-rail member.

7. The system of claim 6, wherein the length comprises a slender length to define a cabling channel with the conductive frame and the conductive cross rail member, wherein a first sidewall of the cabling channel is defined by the conductive frame of the PV module, a second sidewall of the cabling channel is defined by the end of the cross rail member, and a bottom of the cabling channel is defined by the length.

8. The system of claim 6, wherein the second section comprises a single wall key.

9. The system of claim 6, wherein the first keyed section is arranged to insert into a spline opening, wherein the opening defined by the double-wall frame member comprises the spline opening.

10. The system of claim 6, wherein the opening is shaped as a splined hole.

11. A system comprising:
a conductive frame of a photovoltaic (PV) module, the conductive frame comprising a first double-wall side frame member, the first side frame member having two ends and a double-wall middle portion between the two ends, and the conductive frame further comprising a conductive cross rail member; and
an elongated grounding coupler comprising:
a first end, a second end, a length between the first end and the second end, and a first keyed section at the first end, the first keyed section positioned at an end of an upright web of the elongated grounding coupler, the first keyed section configured to insert into the first double-wall side frame member; and
a second section at the second end, the second section configured to mate with an end of the conductive cross rail member of the PV module; and wherein the conductive cross rail member is shaped as an I beam and has at least two flanges, each flange projecting at an acute angle from an upright web of the cross-rail member.

12. The system of claim 11, wherein the length comprises a slender length to define a cabling channel with the conductive frame and the conductive cross rail member, wherein a first sidewall of the cabling channel is defined by the conductive frame of the PV module, a second sidewall of the cabling channel is defined by the end of the cross rail member, and a bottom of the cabling channel is defined by the length.

13. The system of claim 11, wherein the second section comprises a single wall key.

14. The grounding coupler of claim 11, wherein the conductive cross rail member of the PV module is a single upright web cross rail member.

15. The system of claim 11, wherein the first keyed section is arranged to insert into a spline opening, wherein an opening defined by a middle portion of the first side frame member comprises the spline opening.

16. The system of claim 15, wherein the opening is shaped as a splined hole.

* * * * *